(12) United States Patent
Schweitzer, III et al.

(10) Patent No.: US 8,112,235 B2
(45) Date of Patent: Feb. 7, 2012

(54) STATE AND TOPOLOGY PROCESSOR

(75) Inventors: Edmund O. Schweitzer, III, Pullman, WA (US); Marcos A. Donolo, Pullman, WA (US); Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 7 days.

(21) Appl. No.: 12/881,240

(22) Filed: Sep. 14, 2010

(65) Prior Publication Data

US 2011/0004425 A1     Jan. 6, 2011

Related U.S. Application Data

(62) Division of application No. 12/239,678, filed on Sep. 26, 2008, now Pat. No. 7,856,327.

(60) Provisional application No. 60/978,711, filed on Oct. 9, 2007.

(51) Int. Cl.
*G06F 19/00* (2011.01)

(52) U.S. Cl. .......................... 702/60; 715/734

(58) Field of Classification Search .............. 702/60–64, 702/65, 66, 182–185, 188; 715/734
See application file for complete search history.

(56) References Cited

U.S. PATENT DOCUMENTS
2009/0125158 A1 *  5/2009  Schweitzer et al. .......... 700/293
* cited by examiner

*Primary Examiner* — Edward Raymond
(74) *Attorney, Agent, or Firm* — Stoel Rives, LLP

(57) ABSTRACT

A State and Topology Processor (STP) may be communicatively coupled to one or more intelligent electronic devices (IEDs) communicatively coupled to a electrical power system to obtain one or more current measurements, voltage measurements, and dynamic topology data therefrom. The STP may receive the measurement data and may determine a current topology and a voltage topology therefrom. A current processor may use the current topology and the current measurements to refine the measurements, perform KCL, unbalance, symmetrical component, and consistency checks on the electrical power system. The voltage processor may use the voltage topology and the voltage measurements to perform similar checks on the electrical power system. One or more alarms may be generated responsive to the checks. The data may be displayed to a user in a display of a human machine interface and/or may be transmitted to a user programmable task module, and/or an external control unit.

31 Claims, 21 Drawing Sheets

STATE AND TOPOLOGY PROCESSOR

RELATED APPLICATIONS

This Application is a divisional of, and claims priority to U.S. Ser. No. 12/239,678, entitled "State and Topology Processor" filed on 26 Sep. 2008, now U.S. Pat. No. 7,856,327 which claims priority to U.S. Provisional Application No. 60/978,711, entitled "Real Time State and Topology Processor" filed Oct. 9, 2007, both of which are hereby incorporated by reference in their entireties.

TECHNICAL FIELD

This disclosure relates to a device for monitoring and controlling an electrical power system and, more particularly, to a device for receiving power system network data, measurement data, and user-defined thresholds to produce a substation state and topology output, refined current and voltage measurements, and alarms.

BRIEF DESCRIPTION OF THE DRAWINGS

Additional aspects and advantages will be apparent from the following detailed description of preferred embodiments, which proceeds with reference to the accompanying drawings, wherein.

DETAILED DESCRIPTION OF PREFERRED EMBODIMENTS

Figure 1:
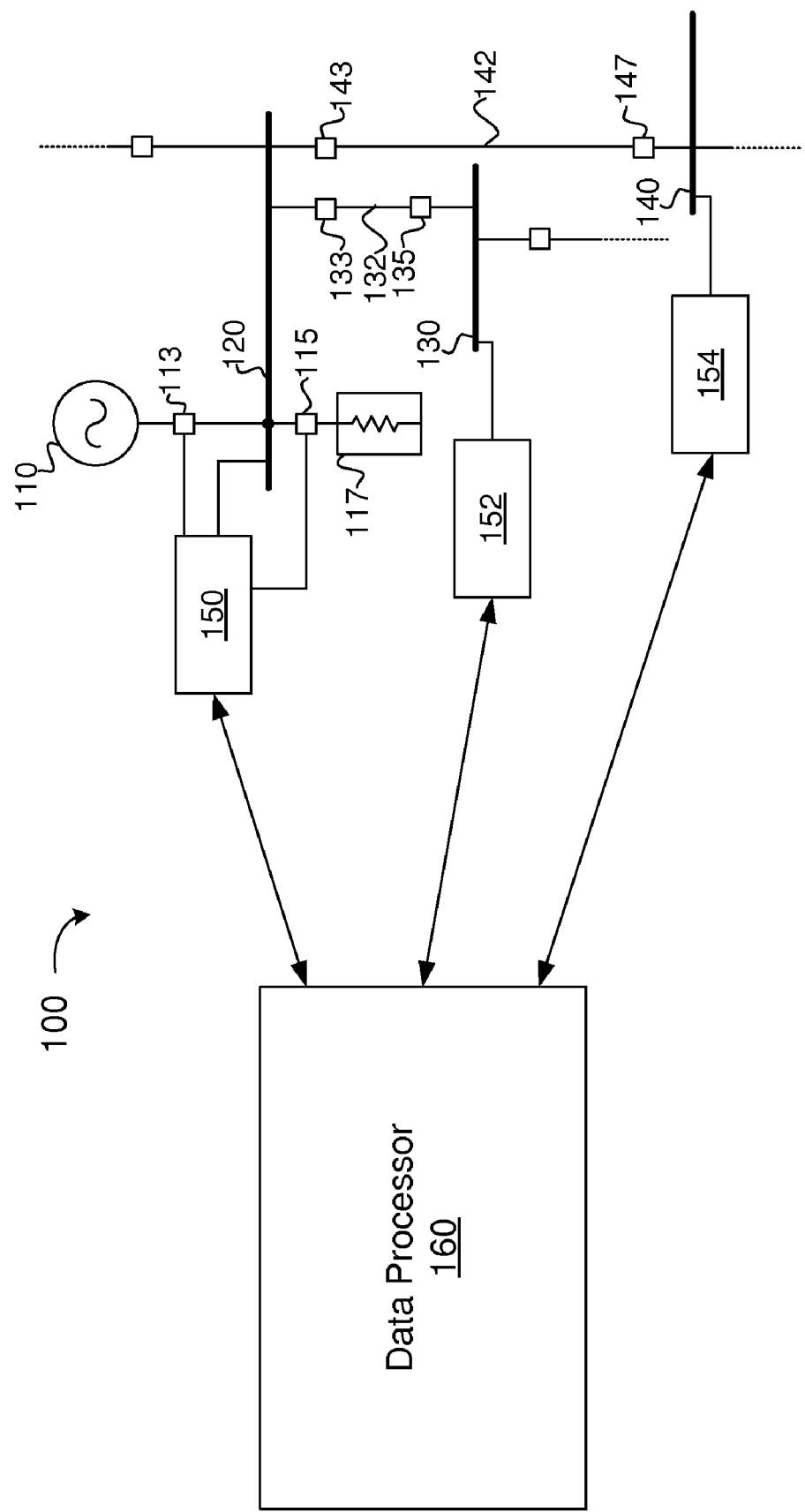
FIG. 1 is a block diagram of one embodiment of a substation state and topology processor in communication with a substation, electrical power system network.

The embodiments of the disclosure will be best understood by reference to the drawings, wherein like elements are designated by like numerals throughout. In the following description, numerous specific details are provided for a thorough understanding of the embodiments described herein. However, those of skill in the art will recognize that one or more of the specific details may be omitted or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps or by a combination of hardware, software, and/or firmware.

Embodiments may also be provided as a computer program product, including a computer-readable storage medium having stored thereon instructions that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Several aspects of the embodiments described will be illustrated as software modules or components. As used herein, a software module or component may include any type of computer instruction or computer executable code located within a memory device and/or transmitted as electronic signals over a system bus or wired or wireless network. A software module may, for instance, comprise one or more physical or logical blocks of computer instructions, which may be organized as a routine, program, object, component, data structure, etc.; that performs one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device or across several memory devices, and may be linked together in fields of a record in a database across a network.

FIG. 1 depicts an exemplary substation, electrical power system network (SEPSN) 100. The SEPSN 100 may comprise various elements used for electrical power transmission and/or power distribution. For example, the SEPSN 100 may comprise a generator 110, which may be connected to a bus 120 via a circuit breaker 113. A load 117 may be connected to the bus 120 via a circuit breaker 115. As used herein, a circuit breaker (such as circuit breakers 113 and 115) may refer to any device capable of interrupting and/or altering an electric circuit and/or an electrical connection (such as a connection between generator 110 and load 117).

A bus 130 may be connected to bus 120 via power transmission line 132. A power transmission line 132 may comprise circuit breakers 133 and 135. A bus 140 may be connected to the bus 120 via a power transmission line 142. The power transmission line 142 may comprise circuit breakers 143, and 147.

One or more Intelligent Electronic Devices (IED) 150, 152, and 154 may be communicatively coupled to one or more elements of the SEPSN 100. As used herein, an IED may refer to any one or combination of a central processing unit (CPU)-based relay and/or protective relay, communication processor, digital fault recorder, phasor measurement unit (PMU), phasor measurement and control unit (PMCU), phasor data concentrator (PDC), wide area control system (WACS), relays with phasor measurement capabilities, wide area protection system (WAPS), a Supervisory Control and Data Acquisition (SCADA) systems, system integrity protection schemes, or any other device capable of monitoring an electrical power system.

In the FIG. 1 embodiment, a PMU 150 may be configured to measure or otherwise sample a signal (e.g., a phase current and/or phase voltage waveform) on bus 120. The waveform may comprise a voltage and/or current waveform corresponding to one or more components of a three-phase signal. Similarly, PMU 152 may be configured to sample a signal waveform present on bus 130, and PMU 154 may be configured to sample a signal waveform present on bus 140.

The PMUs 150, 152, and 154 may be configured to process sampled signal waveforms to calculate, for example, current and/or voltage phasors. The PMUs 150, 152, and 154 may read one or more correction factors (that may be input by the user) for modifying the magnitude and/or phase of a phasor measurement. As used herein, "measurement data" may refer to a phasor measurement of a sinusoidal signal. In some embodiments, measurement data may refer to a measurement of a three-phase, phase current and/or voltage signal (e.g., a measurement may comprise three separate measurements of each phase of a three-phase signal).

The PMUs 150, 152, and 154 may be configured to apply a timestamp to data. This may be done using any phasor measurement and/or timestamping technique and/or methodology known in the art, including, but not limited to the techniques and methods described in: U.S. Pat. No. 6,662,124 entitled, "Protective Relay with Synchronized Phasor Measurement Capability for Use in Electric Power Systems," to Schweitzer, III et al.; U.S. Pat. No. 6,845,333 entitled, "Protective Relay with Synchronized Phasor Measurement Capability for Use in Electric Power Systems," to Anderson et al.; and U.S. Application Pub. No. 2007/0086134 entitled, "Apparatus and Method for Estimating Synchronized Phasors at Predetermined Times Referenced to an Absolute Time Standard in an Electrical System" to Zweigle et al., each of which is hereby incorporated by reference in its entirety.

The measurement data obtained by the PMUs 150, 152, and 154 may be communicated to a Data Processor (DP) 160. In addition, one or more of the PMUs 150, 152, and 154 may communicate dynamic topology data to the DP 160. This dynamic topology data may comprise the state of the circuit breakers and/or switches 113, 115, 133, 135, 143, 147 of the SEPSN 100, and the like. As will be discussed in additional detail below, dynamic topology data may be combined with static network topology data to generate an operating topology of the SEPSN. The static topology data may comprise information, such as: the number of nodes in the SEPSN 100, the connection between various nodes in the SEPSN 100 the measurements available for each node and/or branch in the SEPSN 100, phase current and/or voltage measurement correction factors, and the like.

As used herein, a "node" may refer to a bus, such as buses 120, 130, and 140 of the SEPSN 100, and a "branch," as used herein, may refer to a path of conduction and/or connection between one or more nodes (e.g., a power transmission line comprising zero or more circuit breakers or the like).

Elements 150, 152, and 154 may comprise IEDs, such as PMUs and/or PMCUs, which may be configured to gather measurement data and dynamic topology data for transmission to DP 160. This data may comprise, but is not limited to: one or more phase current measurements on a branch and/or voltage measurements on a node 120, 130, and/or 140; the status of circuit breakers and/or disconnect switches 113, 115, 133, 135, 143, 147; the quality status of these circuit breakers and/or disconnect switches; and the like.

The DP 160 may comprise configuration data including one or more user-defined thresholds. These user-defined thresholds may be used in one or more monitoring functions of the DP 160. For example, the DP 160 may receive phase measurements and dynamic topology data from PMUs 150, 152, and 154. The DP 160 may use this data to evaluate and/or monitor the state of the SEPSN 100. This monitoring may comprise comparing the received measurement and network topology data to the user-defined thresholds. The DP 160 may process the measurements received from the PMUs 150, 152, and 154 and may set one or more alarms responsive to the processing. As will be discussed below, such alarms may include, but are not limited to: current and/or voltage consistency alarms; current and/or voltage unbalance alarms; current and/or voltage symmetrical component alarms; and the like.

Figure 2A:
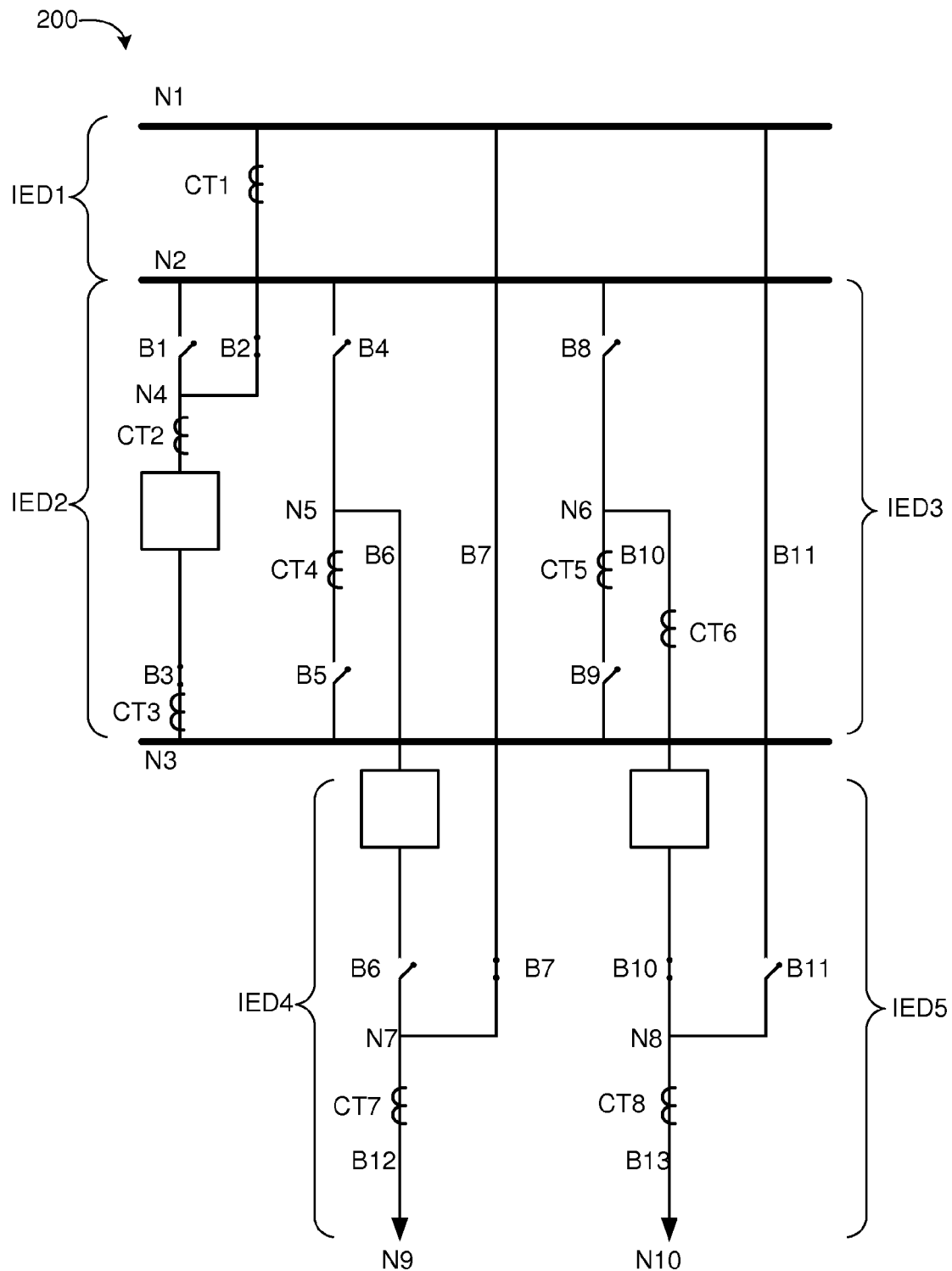
FIG. 2A is a block diagram of an embodiment of a substation, electrical power system network.

FIG. 2A depicts an embodiment of a SEPSN 200 (e.g., substation, electrical power system network). The SEPSN 200 may comprise ten (10) nodes denoted N1 through N10. The SEPSN 200 may further comprise thirteen (13) branches denoted B1 through B13.

The SEPSN 200 may comprise one or more IEDs (elements IED1-IED5) communicatively coupled thereto. IED1 may be communicatively coupled to current transformers (CTs) CT1 and CT2. In this embodiment, IED1 may comprise a PMU and/or PMCU or a relay. CTs 1 and 2 may be used to obtain current measurements on branches in the SEPSN 200. Although not shown in FIG. 2A, one or more voltage transformers may be used to obtain phase voltage measurements on one or more of the nodes (N1-N10) of the SEPSN 200. The CT1 may measure a current between N1 and N4, and CT 2 may measure a current from N3 to N4, and so on. The IEDs coupled to the SEPSN 200 may be in communication with branch elements of the SEPSN 200. For example, IED2 may be communicatively coupled to branch B1 and B2, and may be configured to detect the state of branch B1 and B2 (e.g., whether the branches B1 and/or B2 are closed, and the like).

As depicted in FIG. 2A, the SEPSN 200 may comprise a plurality of IEDs1-5 monitoring one more aspects of the SEPSN 200, including topology data of the SEPSN 200 (e.g., the state of branches B1-B11) and/or measurement data (e.g., phase current measurements obtained by current transformers CT1-CT8). The data collected by the IEDs 1-5 may be transmitted to a state and topology processor (not shown) and made available to various protective and monitoring functions running thereon in one or more data structures. Various embodiments of such data structures are described below in conjunction with FIGS. 2B and 2C.

Figure 2B:
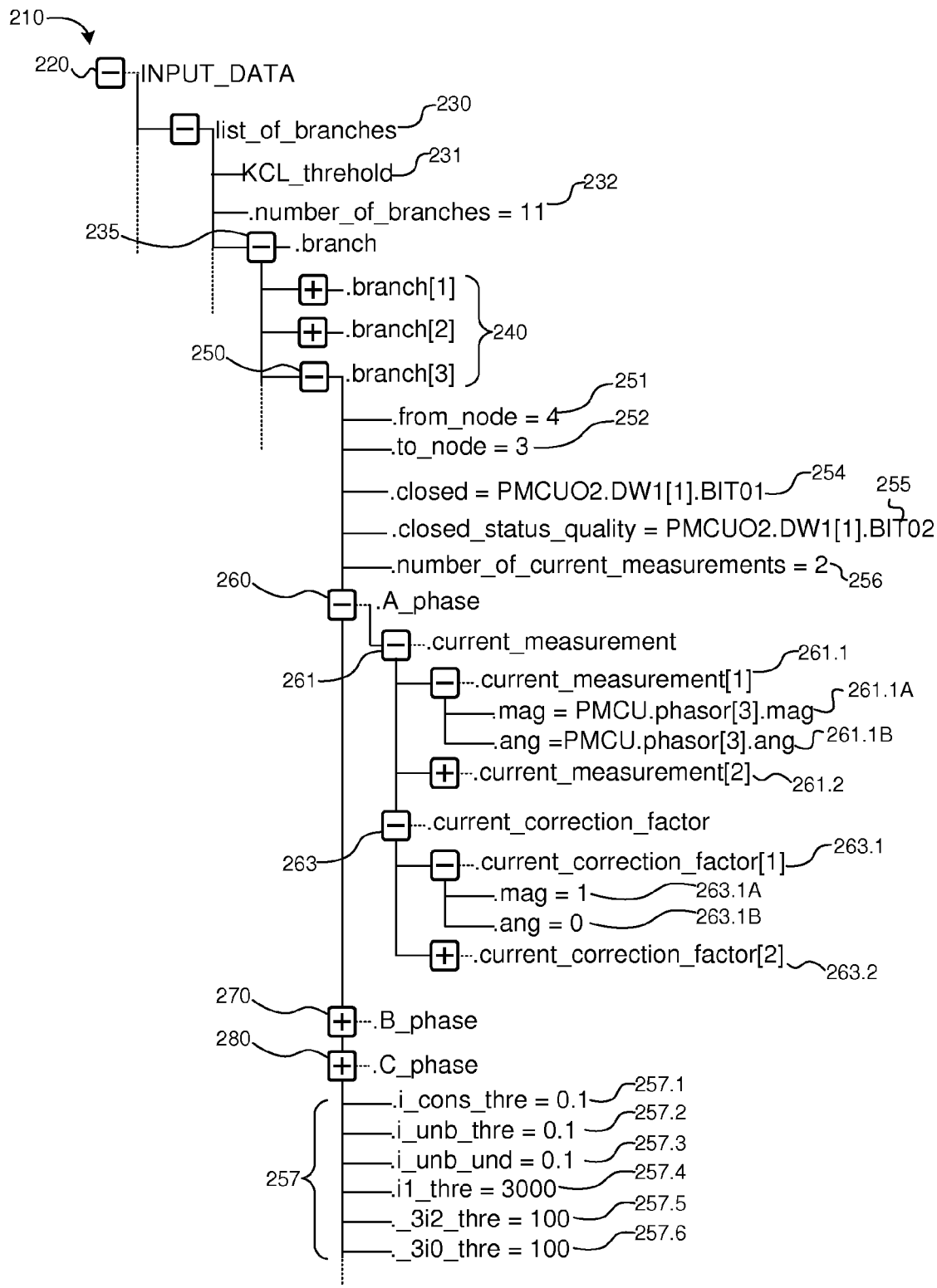
FIG. 2B depicts an embodiment of branch input data structure.
Figure 2C:
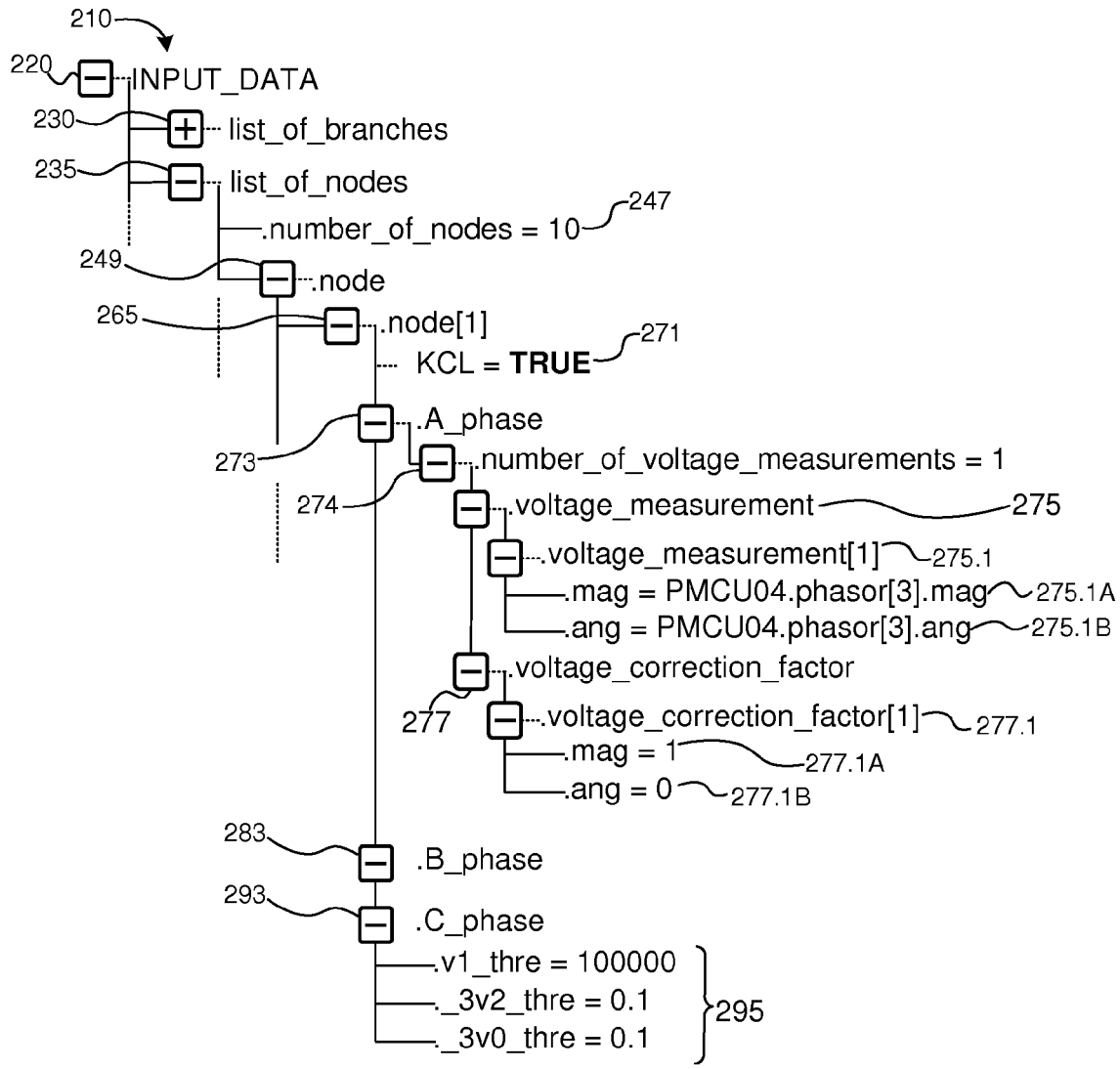
FIG. 2C depicts an embodiment of a node input list data structure.

In one embodiment, two data structures may be used to describe the SEPSN 200, a branch input list data structure (shown in FIG. 2B) and a node input list data structure (shown in FIG. 2C).

The branch input list data structure may comprise information about a branch in a SEPSN (e.g., branches B1-B11 in FIG. 2A). The branch input list data structure may comprise an entry for each branch in the network, and each entry may comprise data describing the branch. As such, the branch input list data structure may comprise:

1) The number of branches in the SEPSN (e.g., 11 branches in FIG. 2A)
2) A branch input data structure for each branch, comprising:
   a) A FROM node identifier;
   b) A TO node identifier;
   c) Branch Closed Status (whether the branch is closed)
   d) Branch Close Status Quality (whether the branch close status is good)
   e) Number of current measurements on the branch
   f) A-Phase measurements
      i) Current measurements
      ii) Current correction factors
   g) B-Phase measurements
      i) Current measurements
      ii) Current correction factors
   h) C-Phase measurements
      i) Current measurements
      ii) Current correction factors
   i) Threshold data
      i) Current consistency threshold
      ii) Current unbalance threshold
      iii) Positive, negative, and zero sequence overcurrent threshold
      iv) KCL threshold FIG. 2B depicts one embodiment 210 of data structure 220, comprising a branch input list data structure 230 corresponding to the SEPSN 200 of FIG. 2A. Although FIGS. 2B and 2C depict tree data structures 210, one skilled in the art would recognize that any data organization technique and/or methodology known in the art could be used under the teachings of this disclosure, and as such, this disclosure should not be read as limited to any particular data structure type.

A top-level node 220 of the tree data structure 210 may be labeled INPUT_DATA. The INPUT_DATA node 220 may be configured to contain a branch list 230, which comprises one or more branch input list data structures 240 described above. Additionally, the INPUT_DATA node 220 may comprise a "list_of_nodes" entry (not shown), which will be described in detail below in conjunction with FIG. 2C.

The "list_of_branches" entry 230 may comprise a "number_of_branches" entry 232 indicating the number of branches in the SEPSN (e.g., in the SEPSN 200 depicted in FIG. 2A, the "number_of_branches=11") and one or more branch input list instances 240. Each node of the SEPSN 200 depicted in FIG. 2A may have a corresponding branch instance 240 (e.g., a branch input list instance 240 for each of the eleven (11) branches in substation network 200).

Branch three (3) (B3 in FIG. 2A) may be described by branch instance 250. Branch instance 250 may comprise one or more child instances defining the branch configuration, the branch state, phase-current measurements on the branch, phase-current correction factors, and one or more user-defined threshold values. For example, a "from_node" 251 may identify the source node of the branch (and a "to_node" 252 may identify a destination node of the branch to accurately reflect the topology of the SEPSN 200; referring back to FIG. 2A, branch 3 (B3) is coupled to nodes N4 and N3.

Referring again to FIG. 2B, the "closed" instance 254 and the "closed_status_quality" instance 255 may indicate that branch (B3) is closed and that the closed quality status is good.

The "number_of_current_measurements" instance 256 may indicate the number of measurements available on the branch (e.g., two (2) measurements for branch B3). Referring again to FIG. 2A, branch B3 comprises two CTs (CT2 and CT3) communicatively coupled thereto.

The "branch" instance 250 may comprise one or more phase-current measurements and phase-current correction factors 260, 270, and 280 associated with the branch 250. An "A_phase" instance 260 may comprise the A phase current measurements and correction factors of the branch 250. A "B_phase" instance 270 may comprise the B phase current measurements and correction factors of branch 3 250. And a "C_phase" instance 280 may comprise the C phase current measurements and correction factors of branch three (3) 250.

Each phase measurement/correction factor instance 260, 270, and 280 may comprise a current measurement instance (e.g., instance 261) and a correction factor instance (e.g., instance 263) for each current measurement on the branch. For example, in FIG. 2B, instance 256 indicates that branch 3 250 comprises two (2) current measurements. As such, the A_phase current measurement instance 261 may comprise two (2) A phase current measurements instances 261.1 and 261.2 under instance 261 and two (2) A phase current correction factors 263.1 and 263.2 under current correction factor instance 263.

A "current_measurement" instance 261.1 may comprise a measured current magnitude measurement 261.1A, and a "current_phase_measurement" instance 261.1.B may comprise a corresponding phase measurement. The current measurement instance 261.2 may comprise similar measurements (not shown).

The "current_correction_factor" instance 263 may comprise a first current correction factor 263.1 associated with the first current measurement instance 261.1. The "current_correction_factor[1]" instance 263 may comprise child instances 263.1A and 263.1B defining a magnitude correction factor 263.1A and a phase-angle correction factor 263.1B. The use of correction factors 263.1 and 263.2 are discussed in more detail below. The "current_correction_factor[2]" instance 263.2 may comprise current correction factors for current measurement 2, 261.2.

The B_phase instance 270 and the C_phase instance 280 may each comprise one or more current measurements (not shown) and current correction factors (not shown) for the B and C phases of a three-phase current, respectively.

The branch instance 250 may comprise one or more user defined constants 257. As discussed above, a branch constant 257 may comprise a current consistency threshold 257.1, a current unbalance threshold 257.2, and a positive, negative, and zero sequence overcurrent threshold. The use of constants 257 is described in more detail below.

The "INPUT_DATA" instance 210 may further comprise a "node_input_list" (not shown in FIG. 2B), which may comprise data describing one or more nodes in a SEPSN (e.g., substation, electrical power system network 200 of FIG. 2A). As such, the "node_input_list" entry may comprise a sub-entry for each node in the network, and each sub-entry therein may comprise data describing the node and any phase voltage measurements thereon. In one embodiment, a node input list structure may comprise:
1) Number of nodes in the SEPSN (e.g., 10)
2) A node_input_data structure for each node, comprising:
  a) KCL node information
  b) A-Phase measurements at the node
    i) Number of voltage measurements
    ii) Voltage measurements
    iii) Voltage correction factors
  c) B-Phase measurements at the node
    i) Number of voltage measurements
    ii) Voltage measurements
    iii) Voltage correction factors
  d) C-Phase measurements at the node
    i) Number of voltage measurements
    ii) Voltage measurements
    iii) Voltage correction factors
  e) Positive-sequence undervoltage threshold
  f) Negative-sequence overvoltage threshold
  g) Zero-sequence overvoltage threshold FIG. 2C depicts one embodiment of a data structure 210 comprising a "node_list" instance 235. As discussed above, the "INPUT_DATA" instance 220 may comprise a "list of branches" instance 230 containing data describing one or more branches in a SEPSN. The "INPUT_DATA" node 220 may further comprise a "list_of nodes" instance 235, which may comprise a "number_of_nodes" instance 247, indicating the number of nodes in the SEPSN. A container instance 249 may comprise a data structure corresponding to each node in the SEPSN. For example, in the SEPSN of FIG. 2A, the container instance 249 may comprise ten (10) instances 265, one for each node in the network 200.

A node instance 265 may comprise a KCL instance 271, which may indicate whether the node is suitable for KCL check. As will be discussed below, a node may be suitable for KCL check if all of the branches reaching the node are accounted for in the substation model. In addition, as will be discussed below, a KCL check may be possible where all the nodes in a particular node group are KCL nodes, and all the branches leaving the group of nodes are metered.

The node instance 265 may further comprise an "A_phase" instance 273 comprising a "number_of_voltage_measurements" instance 274 and a voltage measurement instance 275. The voltage measurement instance 275 may comprise one or more A phase voltage measurement instances 275.1. The "voltage_measurement" instance 275.1 may comprise an A phase magnitude 275.1A and A phase 275.1B. Although not shown in FIG. 2C, a B_phase instance 283 and a C_phase instance 293 may comprise similar voltage measurement nodes.

A_phase instance 275 may further comprise a "voltage_correction_factor" instance 277, which may comprise one or more correction factor instances 277.1. The correction factor instance 277.1 may comprise magnitude 277.1A and phase 277.1B correction factors associated with the voltage measurement 275.1. The use of correction factors 275.1 is described in more detail below. Although not shown in FIG. 2C, the B_phase instance 283 and the C_phase instance 293 may comprise similar voltage correction factors.

The "node[1]" instance 265 may comprise one or more user-defined thresholds 295. As discussed above, the user-defined thresholds 295 may comprise a, positive-sequence undervoltage threshold, a negative-sequence overvoltage threshold, and/or a zero-sequence overvoltage threshold. The use of the user-defined thresholds 295 is discussed in more detail below.

Figure 3:
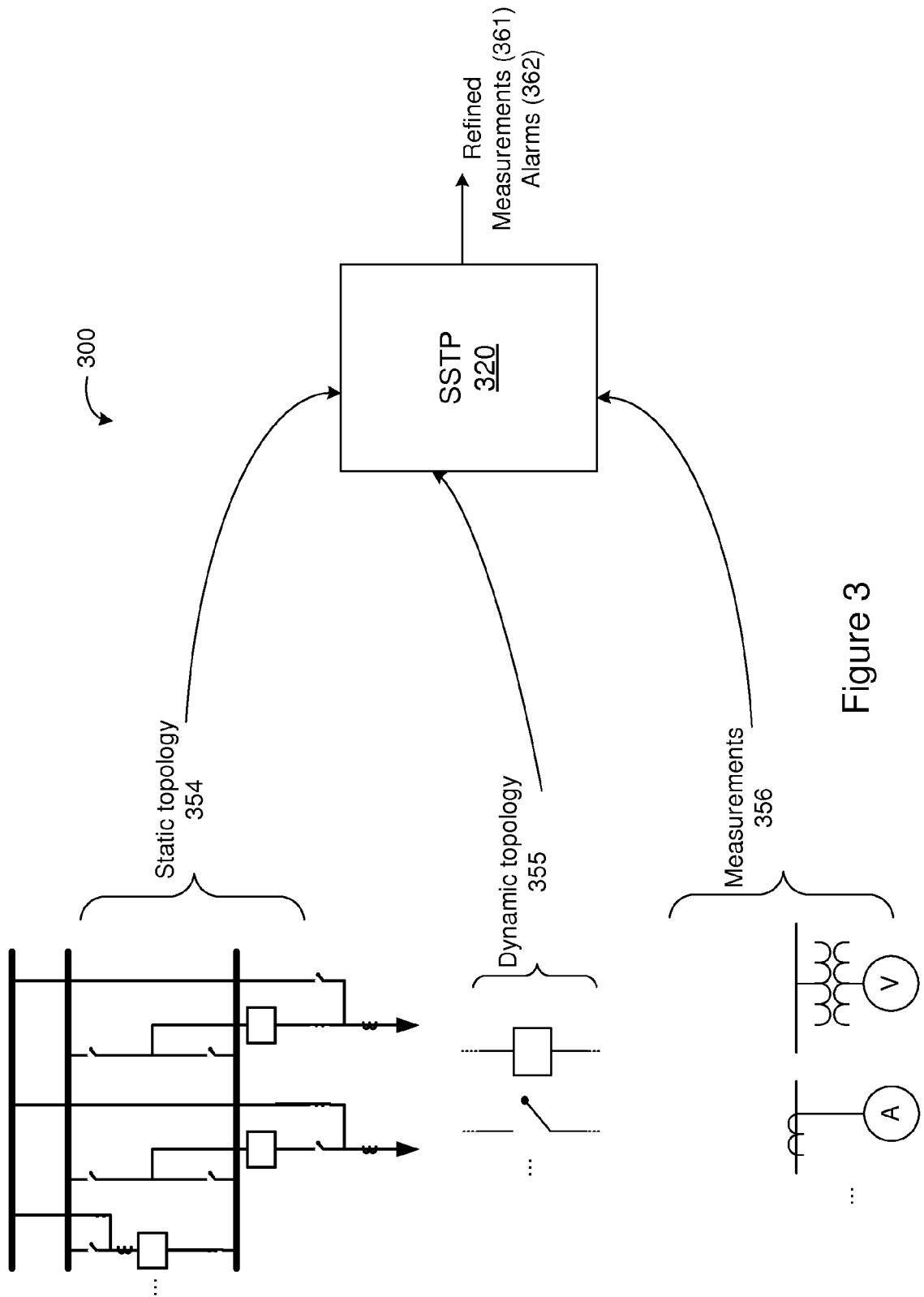
FIG. 3 is a data flow diagram of one embodiment of a substation state and topology processor.

FIG. 3 depicts a data flow diagram 300 of one embodiment of a Substation State and Topology Processor (STP) 360. As shown in FIG. 3, the STP 360 may receive a static topology input 354, a dynamic topology data input 355, and measurement data input 356. In response to these inputs, the STP 360 may output refined measurements 361 and alarms 362. The dynamic topology data may include data such as breaker status, disconnect status, and the like.

As described above in conjunction with FIGS. 2A-2C, the static topology data 354 may comprise a data structure, such as input list data structure 210 of FIGS. 2B and 2C, describing a topology of a SEPSN. The static topology may be input into the STP 360 from an external storage location. Alternatively, the STP may comprise data storage means (e.g., memory, disk, or the like) for storing the static topology data 354. The static topology data 354 may comprise data describing: the nodes in the SEPSN; the branches in the SEPSN; the number of phase current and/or phase voltage measurements available on each node and/or branch; phase voltage and/or current measurement correction factors; and the like.

The STP 360 may receive dynamic topology data 355. The dynamic topology data 355 may comprise data relating to the status of one or more circuit breakers, switches, conductors, conduits, or the like in a SEPSN. As discussed above, the dynamic topology data 355 may be obtained by one or more IEDs and/or PMUs (not shown) communicatively coupled one or more components of the SEPSN. As dynamic topology data 355 is received by the STP 360, the dynamic topology may be used along with the static topology 354 to determine an operating topology of the SEPSN. The operating topology may be embodied as a data structure, such as the tree data structured discussed above in conjunction with FIGS. 2B and 2C. For example, dynamic topology data 355 may comprise data relating to the state of closed branches 254 and/or closed_status_quality node 255 in FIG. 2B.

STP 360 may receive measurement data 356. Measurement data 356 may comprise one or more phase current and/or phase voltage measurements obtained by one or more IEDs, PMUs and/or PMCUs (now shown) communicatively coupled to the SEPSN. As discussed above, the phase voltage and/or current measurements 356 (as well as the dynamic topology data 355) may comprise timestamp information to allow the STP 360 to time align the measurements to a common time standard.

Upon receiving inputs 354, 355, and 356, the STP 360 may be configured to produce one or more normalized and/or refined phase current and/or phase voltage measurements 361. These refined measurements may be used in protective and/or monitoring functions of the SEPSN (not shown). In addition, STP 360 may produce one or more alarms 362. The alarms 362 may be produced if one: or more measurements 354, 355, 356, and/or derivatives thereof exceed or otherwise fall outside of one or more user-defined operating thresholds of STP 360 (e.g., thresholds 257 of FIG. 2B and/or thresholds 295 of FIG. 2C).

Figure 4:
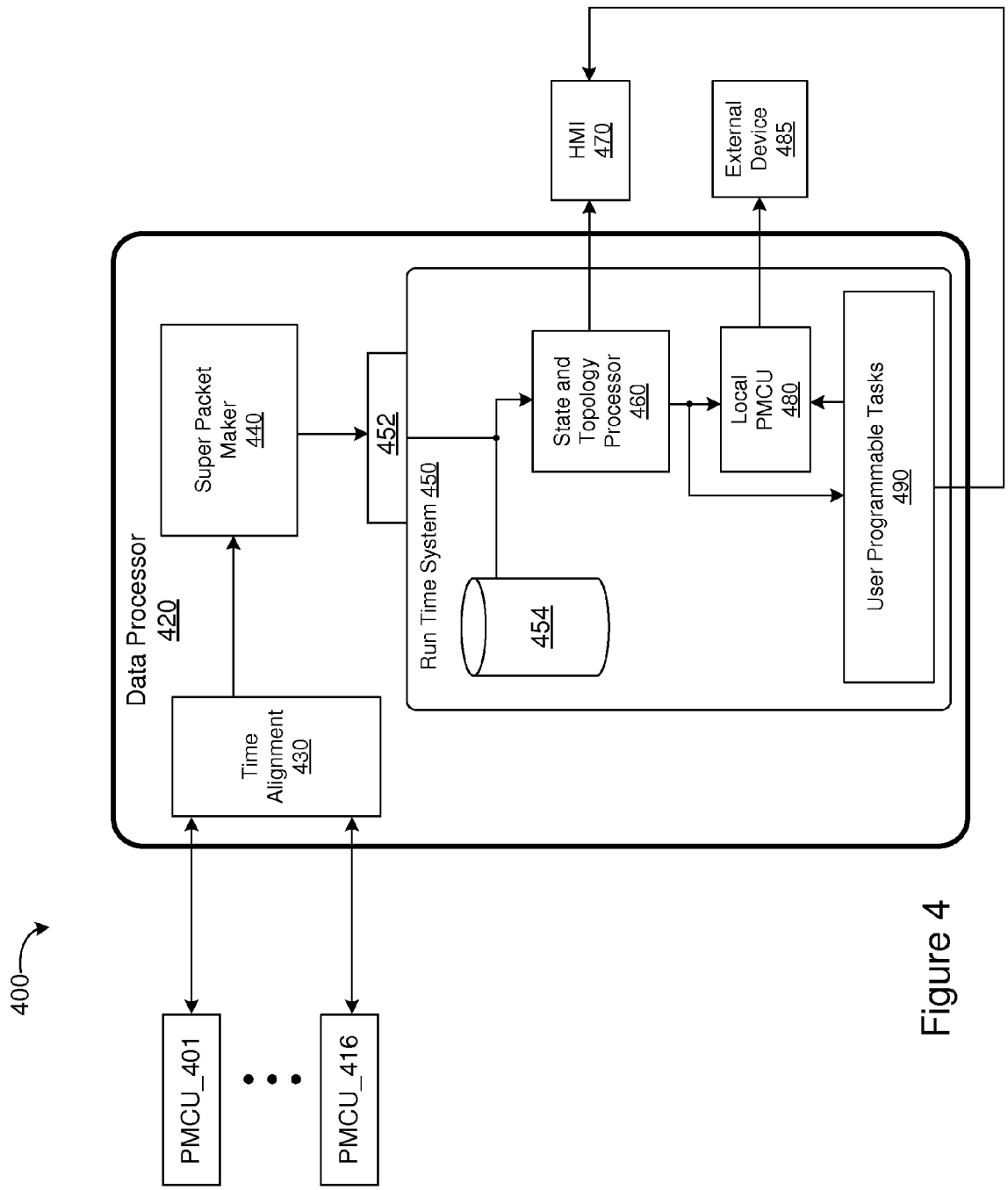
FIG. 4 is a block diagram of a substation state and topology processor.

Turning now to FIG. 4, a block diagram 400 of one embodiment of a Data Processor (DP) 420 is depicted. DP 420 may be communicatively coupled to one or more IEDs, such as relays, phasor measurement and control units (PMCU) and/or phasor measurement units (PMU) 401 or relays and 416 disposed in and/or communicatively coupled to a SEPSN. In FIG. 4, The DP 420 is depicted as communicatively coupled to sixteen (16) PMCUs labeled PMCU_401-PMCU_416. The PMCU_401-416 may be configured to communicate with the DP 420 using a communication standard, such as the IEEE C37.118 standard (hereafter "118 standard"). The 118 standard is a standard for synchronized phasor measurement systems in power systems. The 118 standard is not media dependent and, as such, may be used on EIA-232 and Ethernet communications connections. Accordingly, PMCU_401-416 and DP 420 may be referred to as "118 devices" configured to interact with the PMCU_401-416 using the 118 standard. One skilled in the art, however, would recognize that the PMCU_401-416 and the DP 420 could be configured to use any communications standard and/or protocol known in the art. As such, this disclosure should not be read as limited to any particular communications standard and/or protocol. For instance, in some embodiments, the PMUs 410 through 416 may be communicatively coupled to the DP 420 via Fast Message protocol or the like.

The PMCU_401-416 may provide measurement data and/or network topology data to the DP 420. This data may comprise timestamp information according to the 118 standard, or some other time alignment technique. The messages transmitted by the PCMU_401-416 may comprise time stamping information (e.g., may comprise synchrophasors transmitted according to the 118 standard). The time alignment module 430 may time align such messages using the time stamping information.

Alternatively, in some embodiments, the time alignment module 430 may time align messages from the PMCU_401-416 to a common time reference (not shown), which may provide a common time reference to the DP 420, the PMCU_401-16 communicatively thereto, and/or to other IEDs communicatively coupled to the DP 420. The common time reference (not shown) may be provided by various time sources including, but not limited to: a Global Positioning System (GPS); a radio time source, such as the short-wave WWV transmitter operated by the National Institute of Standards and Technology (NIST) at 2.5 MHz, 5 MHz, 10 MHz, 15 MHz, and 20 MHz, or a low frequency transmitter, such as VW VB operated by NIST at 60 Hz; a cesium clock; an atomic clock; and the like. The time alignment module 430 may modify the magnitude and/or phase of phase measurements received from the PMCU_401-416 to conform to the common time reference (not shown) and/or the PMCU_401-416 may be configured to modify one or more of a magnitude and/or phase measurement to align the measurement to the common time reference (not shown). In addition, in some embodiments, the time alignment module 430 may comprise a buffer memory or other buffering means to time align incoming messages from the PMCU_401-416. However, as discussed above, in the FIG. 4 embodiment, a time reference (not shown) may not be required since the messages themselves may comprise time alignment information (e.g., the messages transmitted by the PMCU_401-416 may comprise synchrophasors or the like).

A super packet maker module 440 may receive the time-aligned measurement and dynamic topology data from time alignment module 430, and may generate a single composite packet comprising the time-aligned data received from the PMCU_401-416. The super packet maker 440 may be configured to communicate with the time alignment module using the 118 standard.

The super packet maker 440 may transmit the packet comprising the time-aligned phasor measurement and/or topology data to Run Time System (RTS) 450. In one embodiment, the super packet maker module 440 may transmit the composite packet RTS 450 using the 118 standard. In this embodiment, the RTS 450 may comprise a 118 protocol gateway module 452, which may be configured to communicate with the super packet maker module 440 using the 118 protocol. In other embodiments, other protocols and/or communications infrastructures may be used in place of the 118 protocol, including, but not limited to: the IEEE 1344 standard; BPA PDCStream; IEC 61850; OPC-DA/OPC-HAD; Internet Protocol (IP); Transmission Control Protocol (TCP); TPC/IP; User Datagram Protocol (UDP); or the like. As such, this disclosure should not be read as limited to any particular communication protocol, communication standard, and/or communication infrastructure.

The RTS 450 may make the time-aligned phase current and/or phase voltage measurements and dynamic topology data received from the PMCUs01-16 401-416 available to a state and topology processor (STP) 460. In addition, the RTS 450 may comprise a data storage module 454, which may be used to store static network topology information relating to the SEPSN monitored by the system and/or the PMCU_401-416. The STP 460 may be communicatively coupled to a data storage module 454, and may be configured to load network topology data therefrom. The network topology data stored in the data storage module 454 may comprise a data structure, such as an input list data structure depicted in FIGS. 2B and 2C (e.g., input list data structure 210), and may include a static topology of the monitored SEPSN. In this embodiment, the STP 460 may be configured to load the data structure from storage module 454, and to then update the structure with the phase-current and/or voltage measurements and dynamic topology data (e.g., status of circuit breakers, switches, and the like) received from the PMCUs01-16.

The STP 460 may access the static and dynamic topology data to refine the received measurements and to perform one or more protective functions and/or system checks. The operation of the STP 460 is described in more detail below.

A human-machine interface (HMI) module 470 may be communicatively coupled to the DP 420 and the STP 460. The HMI module 470 may be configured to display or otherwise make available to a human operator the refined current measurements, the refined phase voltage measurements, and/or alarms (if any) produced by the STP 460. Accordingly, the HMI module 470 may comprise a user interface or other display means to display of the state of the electrical power system to a user.

A local PMCU 480 may be communicatively coupled to the STP 460 and may be configured to receive the refined measurements and/or alarms (if any) produced by the STP 460. The local PMCU 480 may be communicatively coupled (via a communications network supporting, for example, the 118 standard or some other protocol) to an external device 485. The external device 485 may be an IED or other device configured to communicate with the PMCU 480. The external device 485 may be capable of configuring and/or controlling one or more components of the SEPSN (e.g., open and/or close one or more circuit breakers and/or switches, remove and/or add one or more loads or the like). Responsive to the refined measurements and/or alarms generated by the STP 460, the local PMCU 480 may cause the device 485 to reconfigure and/or control the SEPSN to thereby provide protection and/or additional control services to the SEPSN. For example, the external device 485 may be configured to send an alarm indicating undesired operating conditions, cause a circuit breaker to open and/or close, a load to be shed, or the like.

As discussed above, the STP 460 outputs station topology, refined measurements, measurement alarms, unbalanced currents and sequence quantities to the Run Time System 450, including the local PMCU 480 and a user programmable task module 490. The user programmable task module 490 may comprise one or more pre-configured and/or user programmable tasks. As such, the user programmable task module 490 may comprise an IEC 61131-3 compliant device (e.g., a programmable device that complies with the IEC 61131-3 standard). The tasks implemented on the user programmable task module 490 may use the data produced by the STP 460 to monitor the power system. For example, a bus differential protection module (not shown) may be implemented on the user programmable task module 490.

Figure 5:
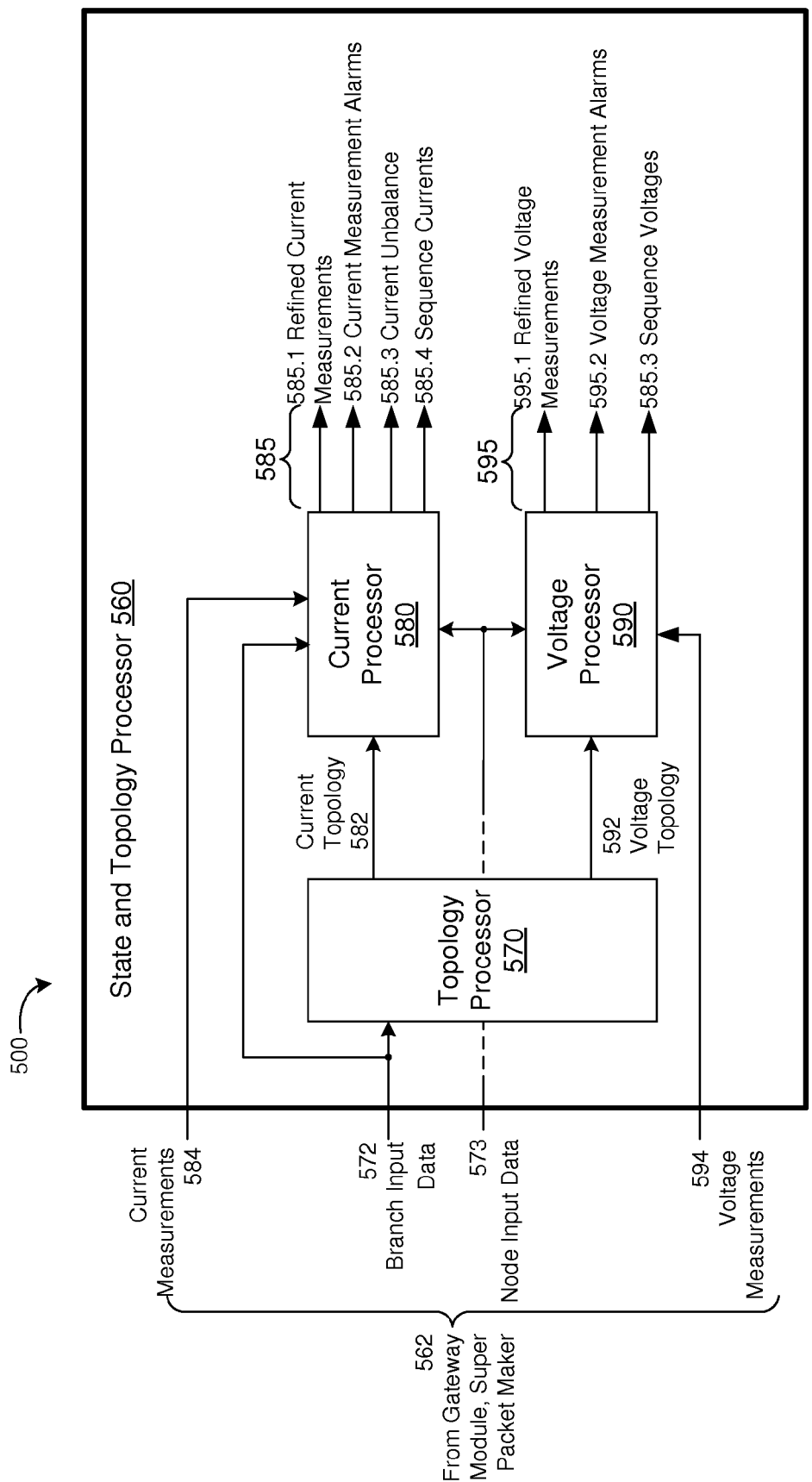
FIG. 5 is a block diagram of a state and topology processor.

FIG. 5 is a block diagram of one embodiment of a state and topology Processor (STP) 560. The STP may receive inputs 562 from a run time engine, such as the Run Time System 450 discussed above.

The STP 560 may comprise a topology processor 570, which may receive branch input data 572. The branch input data 572 may be derived from the static and dynamic topology data discussed above. As such, the branch input data 572 may reflect a state of a SEPSN, and as such, may comprise a combination of static SEPSN configuration data and dynamic SEPSN data. As used herein, the combination of static and dynamic topology data generated by the topology processor 570 may be referred to as an "operating topology" of a SEPSN.

The topology processor 570 may use branch input data 572 to generate a current topology 582 and a voltage topology 592. Jointly, the current topology 582 and the voltage topology 592 may comprise an operating topology of the SEPSN. The current topology 582 feeds a current processor 580 and the voltage topology 592 feeds a voltage processor 590.

The topology processor 570 may merge network nodes to create node groups according to the closed status of the branches within topology data 572. To create the current topology 582, the topology processor 570 may merge nodes when the non-metered branches are closed or when the branch closed status quality of the branch is false. To create the voltage topology 592, topology processor 570 may merge nodes when branches are closed. A more detailed description of current topology 582 and voltage topology 592 are provided below.

The current processor 580 may receive the current topology 582, node data 573, and current measurements 584 and produce outputs 585, which may comprise refined current measurements 585.1, current unbalance conditions 585.3, and sequence currents 585.4. In addition, current processor 580 may provide user-defined alarms 585.2 for current unbalance and symmetrical component conditions. Systems and methods for generating outputs 585 are described in additional detail below.

The voltage processor 590 may receive the voltage topology 592, node data 573, and voltage measurements 594 and produce outputs 595, which may comprise refined voltage measurements 595.1 and sequence voltages 595.3. In addition, the voltage processor 590 may provide user-defined alarms 595.2 for voltage symmetrical component conditions, measurement consistency. Systems and methods for generating outputs 595 are provided below.

As discussed above, the topology processor 570 may use branch input data 572 (comprising the static topology and the dynamic topology data) to generate an operating topology of the SEPSN comprising a current topology 582 and a voltage topology 592.

The current topology may comprise the list of groups of nodes and the branch to node list. The nodes inside every group of nodes are connected by closed branches that have no current measurements. The branches to node list may specify which metered closed branches connect which group of nodes.

The voltage topology may comprise a list of groups of nodes and a branches to node list. The nodes inside every group of nodes are connected by closed branches (with or without current measurements). The branches to node list may specify which open branches with closed status quality equal to false connect which groups of nodes.

Figure 6:
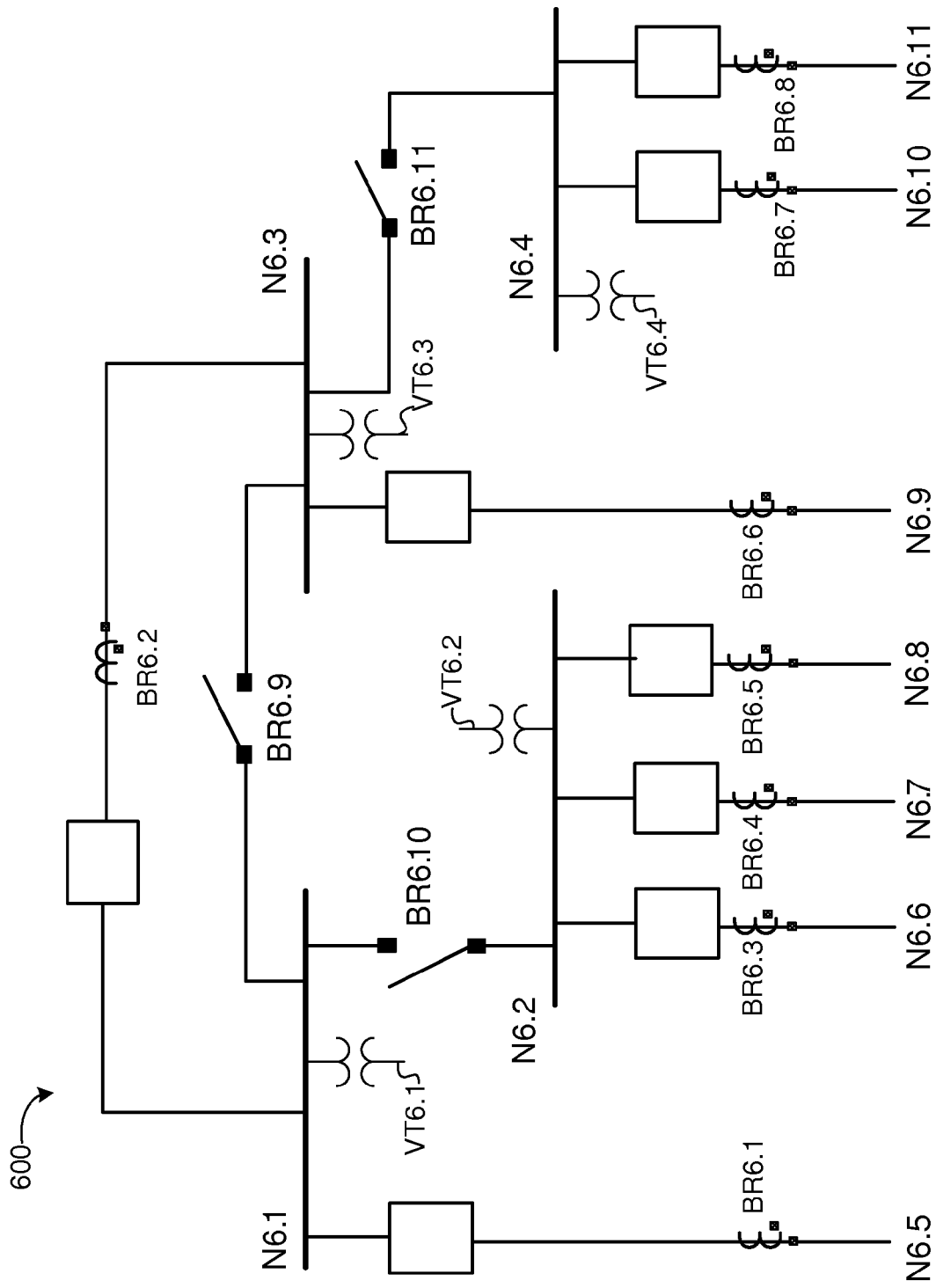
FIG. 6 is a block diagram of a substation, electrical power system network.

Turning now to FIG. 6, an exemplary SEPSN 600: is depicted to illustrate one embodiment of a node merging process. The network 600 may comprise eleven (11) nodes (denoted N6.1 through N6.11), seven terminal nodes (N6.5-N6.11) (where KCL=FALSE), eight metered branches (BR6.1 through BR6.8) as such, branches BR6.1 through BR6.9 may comprise a current transformer, and three (3) non-metered branches (BR6.9 through BR6.11). Nodes N6.1, N6.2, N6.3 and N6.4 may comprise a voltage transformer (respectively VT6.1, VT6.2, VT6.3, and VT6.4) attached and/or communicatively coupled thereto to measure a voltage on Nodes N6.1 through N6.4.

Figure 9:
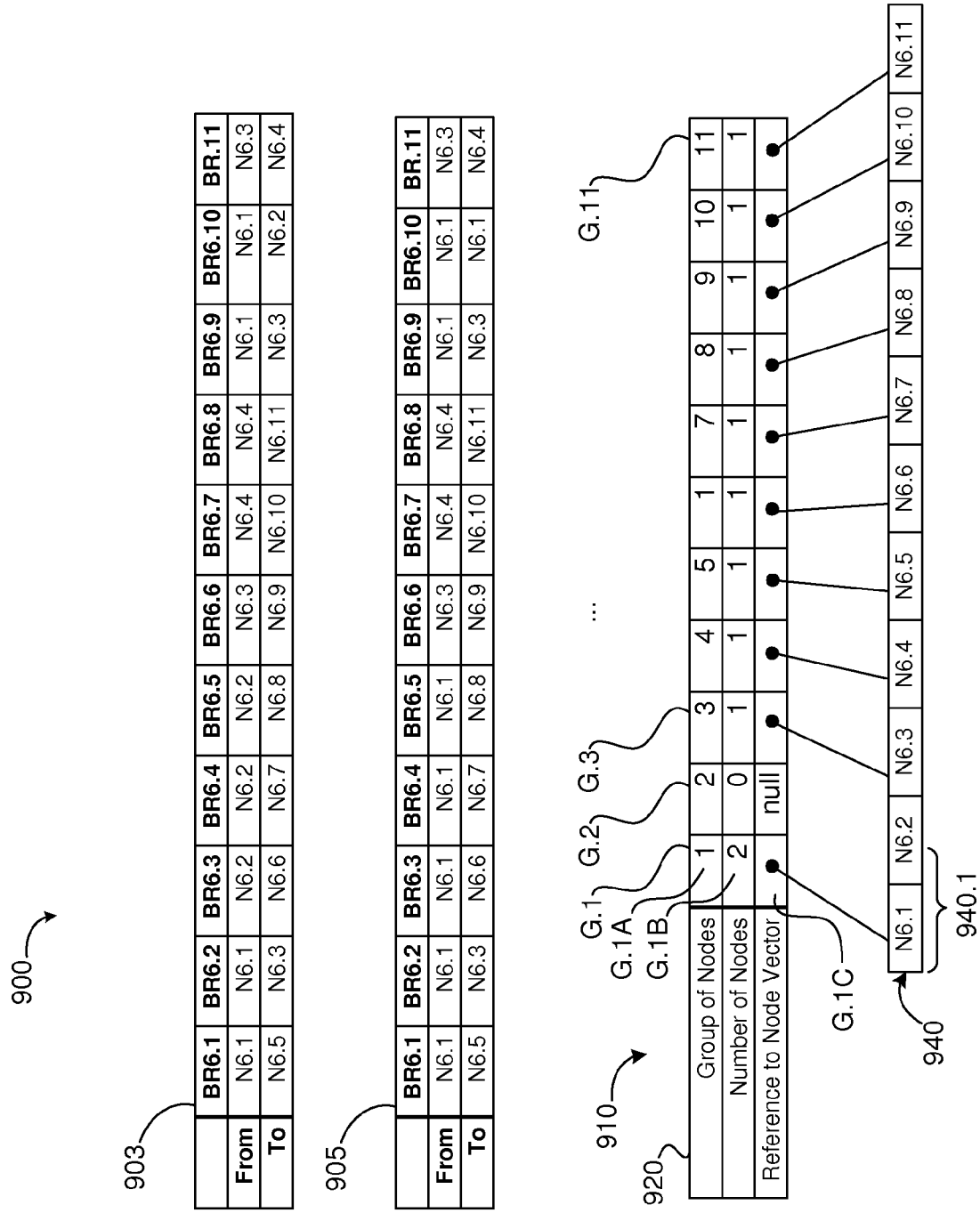
FIG. 9 is a block diagram of a current and/or voltage node vector.

When all merging switches of FIG. 6 are open (e.g., branches BR6.9-11 are open as shown in FIG. 9), the current processor branch-to-node data may be represented by table 1 below:

TABLE 1

|  | BR6.1 | BR6.2 | BR6.3 | BR6.4 | BR6.5 | BR6.6 | BR6.7 | BR6.8 | BR6.9 | BR6.10 | BR6.11 |
|---|---|---|---|---|---|---|---|---|---|---|---|
| From Node ID | N6.1 | N6.1 | N6.2 | N6.2 | N6.2 | N6.3 | N6.4 | N6.4 | N6.1 | N6.1 | N6.3 |
| To Node ID | N6.5 | N6.3 | N6.6 | N6.7 | N6.8 | N6.9 | N6.10 | N6.11 | N6.3 | N6.2 | N6.4 |

Nodes in the current topology branch-to-node data may be merged when a non-metered branch is closed or when the branch close status quality of the non-metered branch is FALSE. After a non-metered branch closes (or its close status quality is FALSE), the topology processor may replace all instances of the non-metered branch TO node identifier with the FROM node identifier in the branch-to-node data array. The TO node identifier and FROM node identifier may be defined in a structure, such as data structure 210, discussed above in conjunction with FIG. 2B.

In the FIG. 6 example, the dynamic topology data 572 associated with the SEPSN 600 may indicate that branch 10 (BR6.10) has closed. Referring back to FIG. 2B, this may be indicated in the input data 210 structure as setting element 254 to TRUE and/or element 255 close status quality indicator to FALSE for the branch. Closing branch BR6.10 may merge nodes N6.1 and N6.2. As such, the branch-to-node data of Table 1 may be updated as shown in Table 2, such that the TO node ID of the merged branch (BR6.2) is replaced by the FROM node ID of the merged branch:

TABLE 2

| | BR6.1 | BR6.2 | BR6.3 | BR6.4 | BR6.5 | BR6.6 | BR6.7 | BR6.8 | BR6.9 | BR6.10 | BR6.11 |
|---|---|---|---|---|---|---|---|---|---|---|---|
| From Node ID | N6.1 | N6.1 | N6.1 | N6.1 | N6.1 | N6.3 | N6.4 | N6.4 | N6.1 | N6.1 | N6.3 |
| To Node ID | N6.5 | N6.3 | N6.6 | N6.7 | N6.8 | N6.9 | N6.10 | N6.11 | N6.3 | N6.1 | N6.4 |

As shown in Table 2, the FROM node ID of BR6.3-BR6.5 has been changed from N6.2 to N6.1 and the TO node ID of BR6.10 has been changed from N6.2 to N6.1.

Using the branch-to-node data, the topology processor 570 may generate groups of nodes for consistency checks and/or current refinement. Table 3 may represent a group of nodes and branch list generated from Table 2 for current topology 582:

TABLE 3

| Group of Nodes for Current Topology | Branch List |
|---|---|
| N6.1, N6.2 | BR6.1, BR6.2, BR6.3, BR6.4, BR6.5 |
| N6.3 | BR6.2, BR6 |
| N6.4 | BR6.7, BR6.8 |

In Table 3, BR6.10 is omitted since the FROM node and TO node of BR6.10 are the same (see table 2).

Like the current topology branch-to-node data, the voltage topology branch-to-node data may comprise branch to node interconnection information. As discussed above, this information may be determined by evaluating static and dynamic topology data. For the purposes of the voltage topology branch-to-node data, the topology processor 570 may merge a branch if the branch status is closed (e.g., element 254 of FIG. 2B) and the close status quality indicator is TRUE for the branch (e.g., element 255 of FIG. 2B).

A voltage branch-to-node data for the SEPSN 600, before closing branch BR6.2, is provided in Table 4:

TABLE 4

| | BR6.1 | BR6.2 | BR6.3 | BR6.4 | BR6.5 | BR6.6 | BR6.7 | BR6.8 | BR6.9 | BR6.10 | BR6.11 |
|---|---|---|---|---|---|---|---|---|---|---|---|
| From | N6.1 | N6.1 | N6.2 | N6.2 | N6.2 | N6.3 | N6.4 | N6.4 | N6.1 | N6.1 | N6.3 |
| To | N6.5 | N6.3 | N6.6 | N6.7 | N6.8 | N6.9 | N6.10 | N6.11 | N6.3 | N6.2 | N6.4 |

After closing Branch BR6.2, the topology processor may merge nodes N6.1 and N6.3, and all instances of the branch TO node may be replaced with the FROM node ID in the voltage branch-to-node data array. This change is reflected in the updated voltage branch-to-node data of Table 5:

TABLE 5

| | BR6.1 | BR6.2 | BR6.3 | BR6.4 | BR6.5 | BR6.6 | BR6.7 | BR6.8 | BR6.9 | BR6.10 | BR6.11 |
|---|---|---|---|---|---|---|---|---|---|---|---|
| From | N6.1 | N6.1 | N6.2 | N6.2 | N6.2 | N6.1 | N6.4 | N6.4 | N6.1 | N6.1 | N6.1 |
| To | N6.5 | N6.1 | N6.6 | N6.7 | N6.8 | N6.9 | N6.10 | N6.11 | N6.1 | N6.2 | N6.4 |

In Table 5, all references to node 3 (N6.3) have been replaced with the merged node 1 (N6.1), including the TO node IDs in branches 2 and 9 (BR6.2, BR6.9) and the FROM node IDs in branch 6 and 11 (BR6.6, BR6.11).

Using the voltage branch-to-node data of table 5, the topology processor 570 may generate groups of nodes for voltage consistency checks and/or voltage measurement refinement. Table 6 may represent a voltage node group generated from Table 5:

TABLE 6

Group of Nodes for
Voltage Topology

N6.1, N6.3
N6.2
N6.4

In Table 6, only nodes having voltage measurements thereon may be included (e.g., only node IDs N6.1-N6.4). Nodes 1 and 3 (N61, N6.3) are in the same group, since after closing branch 9 (BR6.2), these nodes may be at a common voltage level.

Figure 7A:
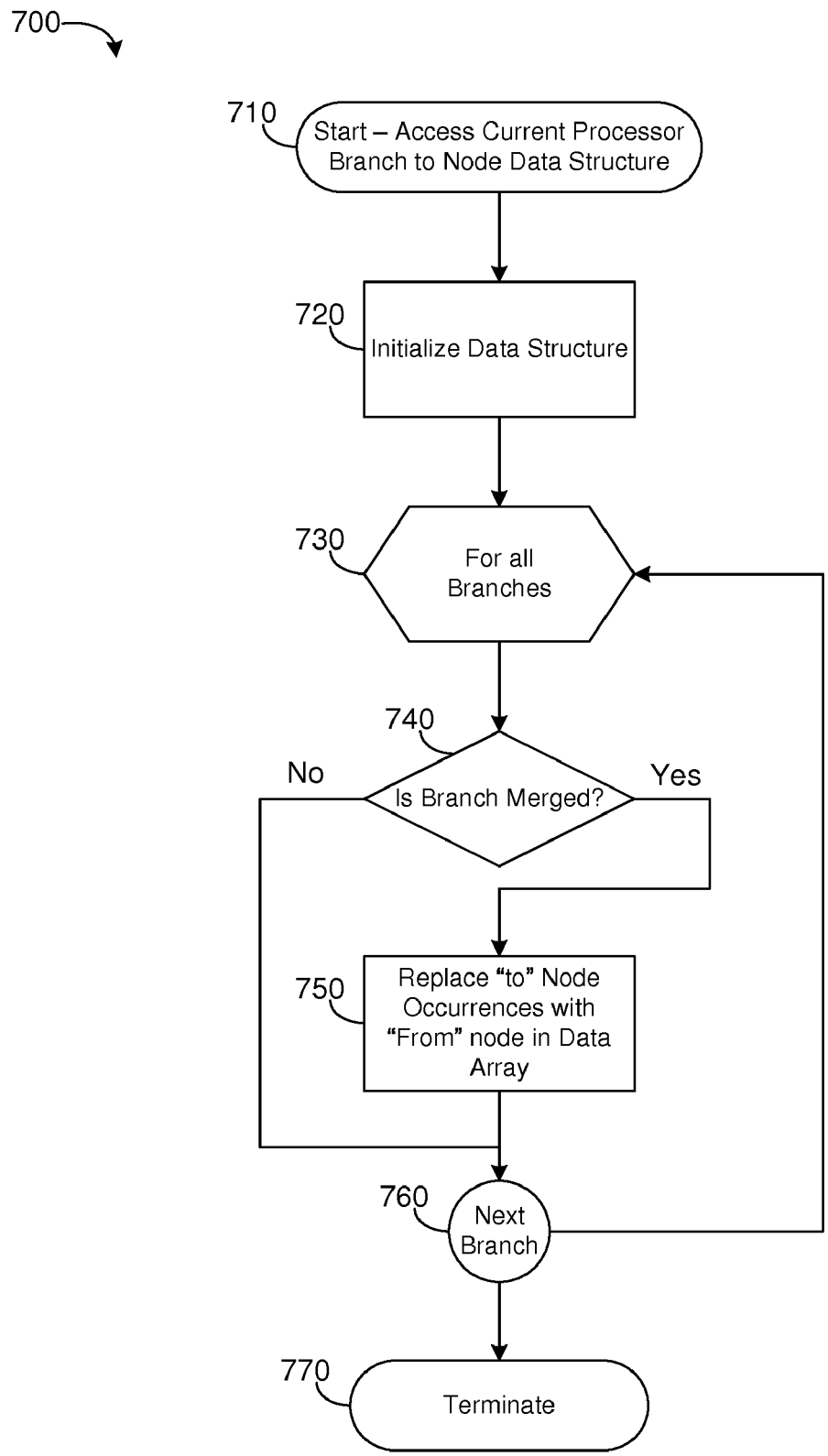
FIG. 7A is a flow diagram of a method for processing merged branches in a current branch-to-node data structure.

FIG. 7A is a flow diagram of one embodiment of a method 700 for processing merged branches in a current processor branch-to-node data structure. At step 710, a branch-to-node data array may be obtained. Step 710 may comprise accessing the topology data (e.g., the input 572 of FIG. 5). At step 720, the topology data may be used to initialize a current processor branch-to-node data array. As discussed above, the current processor branch-to-node data of step 720 may be initialized by analyzing static and dynamic topology data to determine the state of the interconnections therein. The result of step 720 may be one or more branch-to-node data arrays as depicted in tables 1, 2, and 3.

At step 730, method 700 may loop through every branch defined in the current topology branch-to-node data array obtained at step 720. At step 740, the merged status of a branch may be determined. As discussed above, for a current branch-to-node data, a branch may be merged if the topology data indicates that the branch is closed (e.g., element 254 of FIG. 2B, "closed" node has value TRUE) and/or the closed quality status is false (e.g., element 255 of FIG. 2B, "closed_quality_status").

At step 750, the branch-to-node data structure may be updated to reflect the merged status of the branch. As discussed above, this may comprise replacing all instances of the TO node ID in the merged branch with the FROM node ID in the current branch-to-node data structure.

At step 760, method 700 may determine whether all the branches in the branch-to-node data have been processed per steps 740-750. If not, the flow may continue at step 740 where the next branch in the current processor branch-to-node data may be processed; otherwise, the flow may terminate at step 770.

Figure 7B:
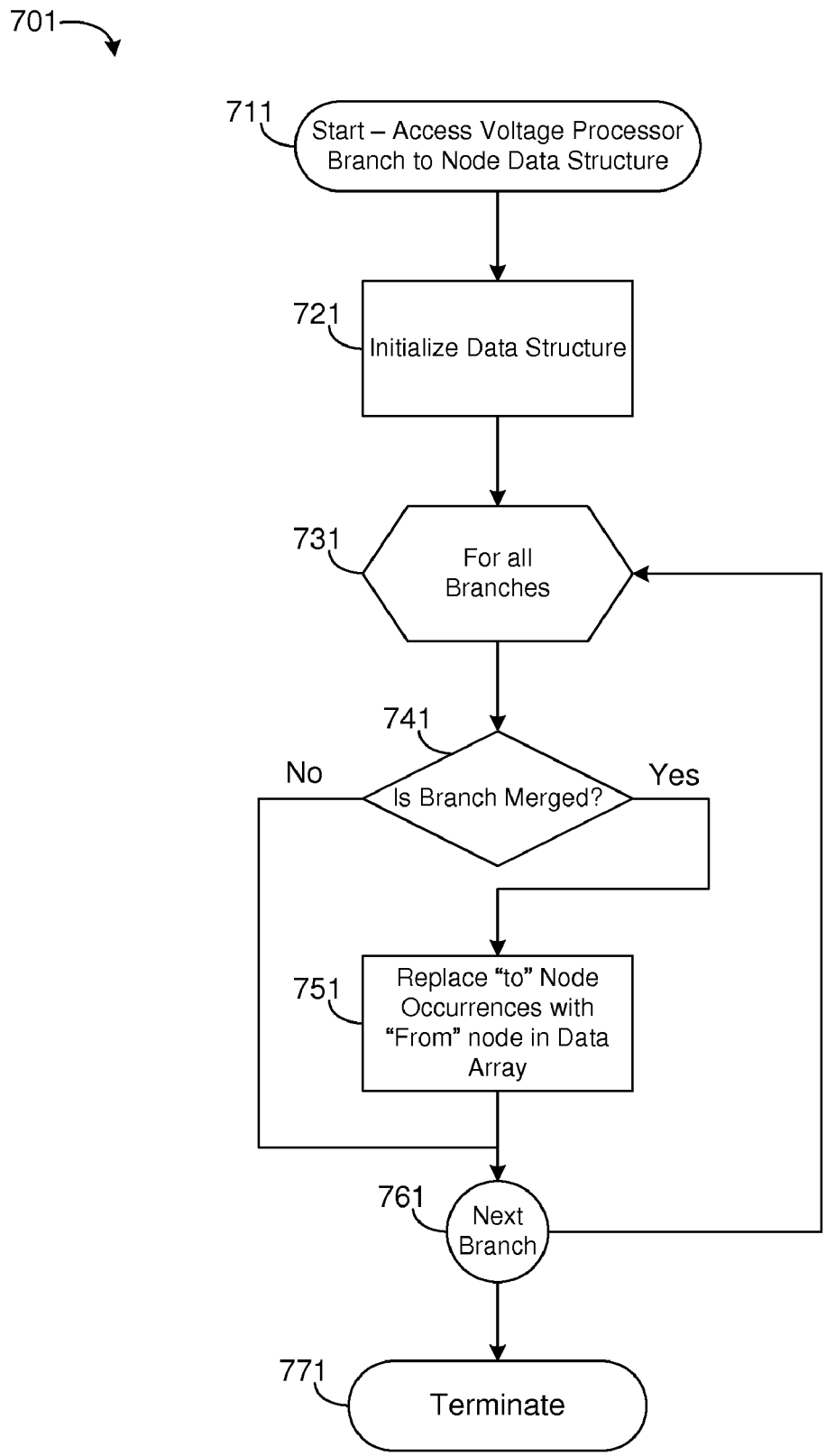
FIG. 7B is a flow diagram of a method for processing merged branches in a voltage branch-to-node data structure.

FIG. 7B is a flow diagram of one embodiment of a process 701 for merging nodes in a voltage processor branch-to-node data structure. Process 701 may be substantially the same as process 700 discussed above in conjunction with FIG. 7A with the exception of step 741 (740 in FIG. 7A).

At step 741, a branch in the voltage branch-to-node data, may be merged if the topology data indicates that the branch is closed (e.g., element 254 of FIG. 2B, "closed" node has a value of TRUE) and/or the closed quality status is true (e.g., element 255 of FIG. 2B, "closed_quality_status"). If step 740 determines that the branch is merged, the flow may continue to step 750; otherwise, the flow may continue to step 760. After determining the status of each branch in the voltage processor branch-to-node array substantially as described above, the flow may terminate at step 771.

After initializing and processing the current branch-to-node data and the voltage branch-to-node data, the topology processor 570 may create one or more node groups of nodes (e.g., groups such as the current topology group of table 3 and the voltage topology group of table 6).

The current group(s) may be based upon the current branch-to-node data structure and may comprise group(s) with current measurements on every branch leaving the group. A current processor module (e.g., current processor module 580 of FIG. 5) may use these group(s) to perform current consistency checks, KCL check, measurement refinement, and the like.

The voltage group(s) may be based upon the voltage branch-to-node data structure and may comprise group(s) of nodes. A voltage processor module (e.g., voltage processor module 590 of FIG. 5) may use these group(s) to perform voltage consistency checks, measurement refinement, and the like.

The current group(s) may be formed from a current node vector. In a current node vector, nodes may be grouped by whether they have been "merged" with one or more other nodes in the array. For example, if a particular node (e.g., node X) is merged into a branch (it is the TO node ID of a merged branch), the number of nodes associated with node X may be zero (0). If node X is by itself (e.g., not merged, nor has any nodes merged therein), the number of nodes associated with node X may be one (1). If other nodes are merged into node X (e.g., it is the FROM node ID of a merged branch), the number of nodes associated with node X may be the number of merged nodes plus one (1).

Similarly, the voltage group(s) may be formed from a voltage node vector. In the voltage node vector, nodes may be grouped by whether they have been "merged" with one or more other nodes in the array. For example, as above, if a particular node (e.g., node Y) is merged with another node due to a closed branch (it is the TO node of a merged branch), the number of nodes associated with node Y may be zero (0). If the node Y is by itself (e.g., not merged into another node, nor has any nodes merged therein), the number of nodes associated with node Y may be one (1). If other nodes are merged into node Y (e.g., it is the FROM node of a merged branch), the number of nodes associated with node Y may be the number of merged nodes plus one (1).

Figure 8A:
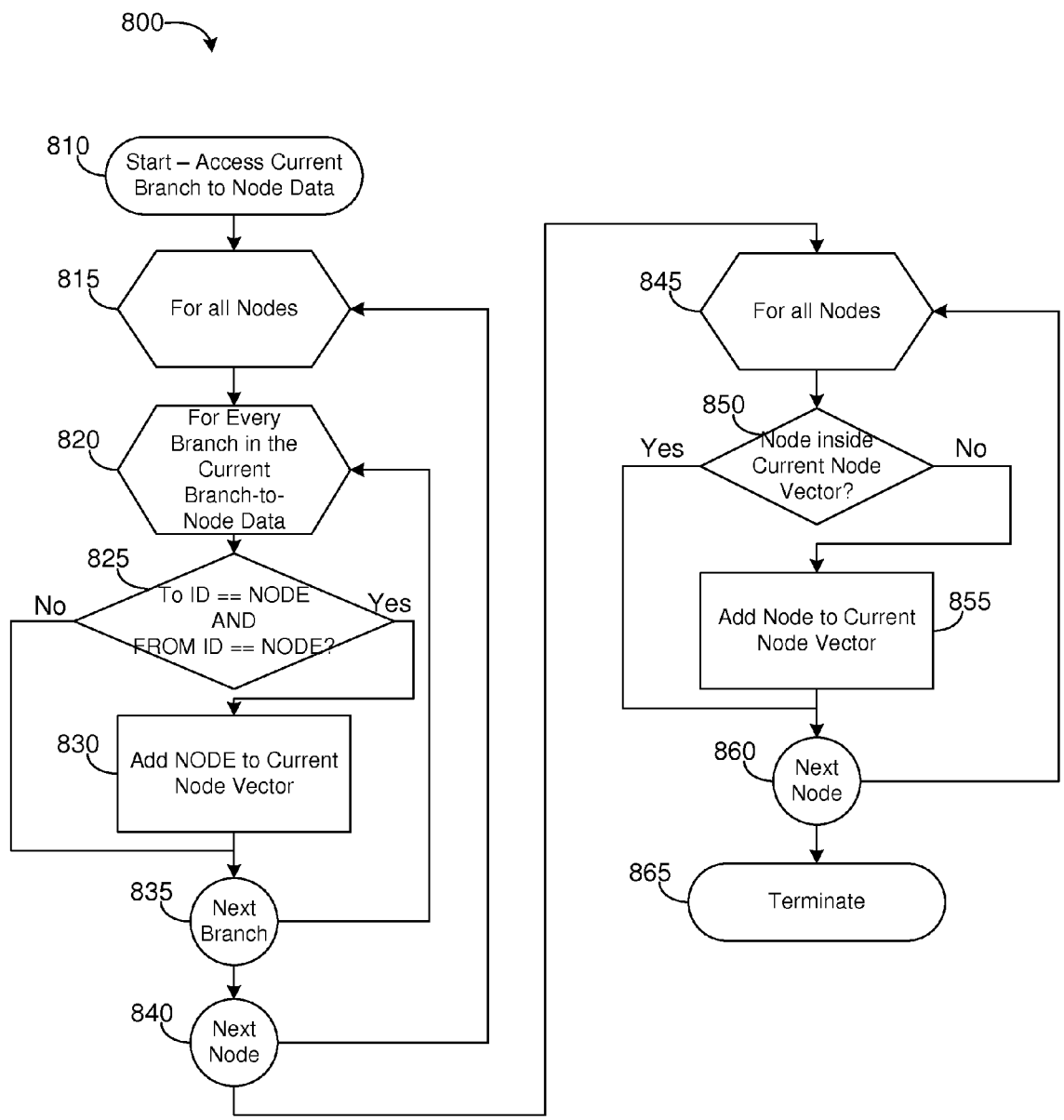
FIG. 8A is a flow diagram of one embodiment of a method for generating a current node vector.

FIG. 8 is a flow diagram of one embodiment of a method 800 for generating a current node vector is depicted. At step 810, the node vector may be initialized from SEPSN topology data (static and/or dynamic) and a current branch-to-node data structure may be obtained. In one embodiment, the input data received at step 810 may comprise a current branch-to-node data array produced by method 700 of FIG. 7A.

At step 815, each node in the topology may be processed (e.g., steps 820 through 835 may be performed on each node in the topology), and at step 820, each branch in the branch-to-node data arrays may be processed (e.g., steps 825 through 830 may be performed for each branch).

At step 825, process 800 may determine if the TO node ID and the FROM node ID in the branch being processed are the same as the current node (e.g., if the node was merged per process 700 of FIG. 7A). If so, the flow may continue to step 830; otherwise, the flow may continue to step 835.

At step 830, the TO ID and the FROM ID branch nodes may be added to a current node vector (or any other data structure capable of holding a number of entries), which may contain nodes belonging to the same group (hereafter current node vector). The current node vector may comprise one or more pointers (or other data references) to the nodes comprising the group. The current node vector may comprise a counter indicating the number of nodes in a particular entry. Accordingly, at step 830, the counter may be incremented if necessary.

At step 835, method 800 may determine whether there are additional branches to process. If so, the flow may continue to step 820; otherwise, the flow may continue to step 840. At step 840, method 800 may determine whether there are additional nodes to process. If so, the flow may continue to step 815; otherwise, the flow may continue to step 845.

At step 845, method 800 may again iterate over all of the nodes in the topology (e.g., may perform steps 850 through 860 on each node). At step 850, process 800 may determine whether the node is in the current node vector (e.g., linked to and/or referenced by an entry in the current node vector). If the node is in the current node vector, the flow may continue to step 860; otherwise, the flow may continue to step 855.

At step 855, the node may be added to the current node vector. This step may be required where the node is "by itself". As such, at step 855, the node may be added to a new node vector comprising only the node itself.

At step 860, process 800 may determine whether there are additional nodes to process. If so, the flow may continue at step 845 where the next node may be processed; otherwise, the flow may terminate at step 865.

As described above, method 800 of FIG. 8 may be used to generate a current node vector. In addition, method 800 may generate a voltage node vector. These vectors may be generated separately (e.g., in separate iterations of method 800) or concurrently (e.g., in the same iteration of method 800).

Figure 8B:
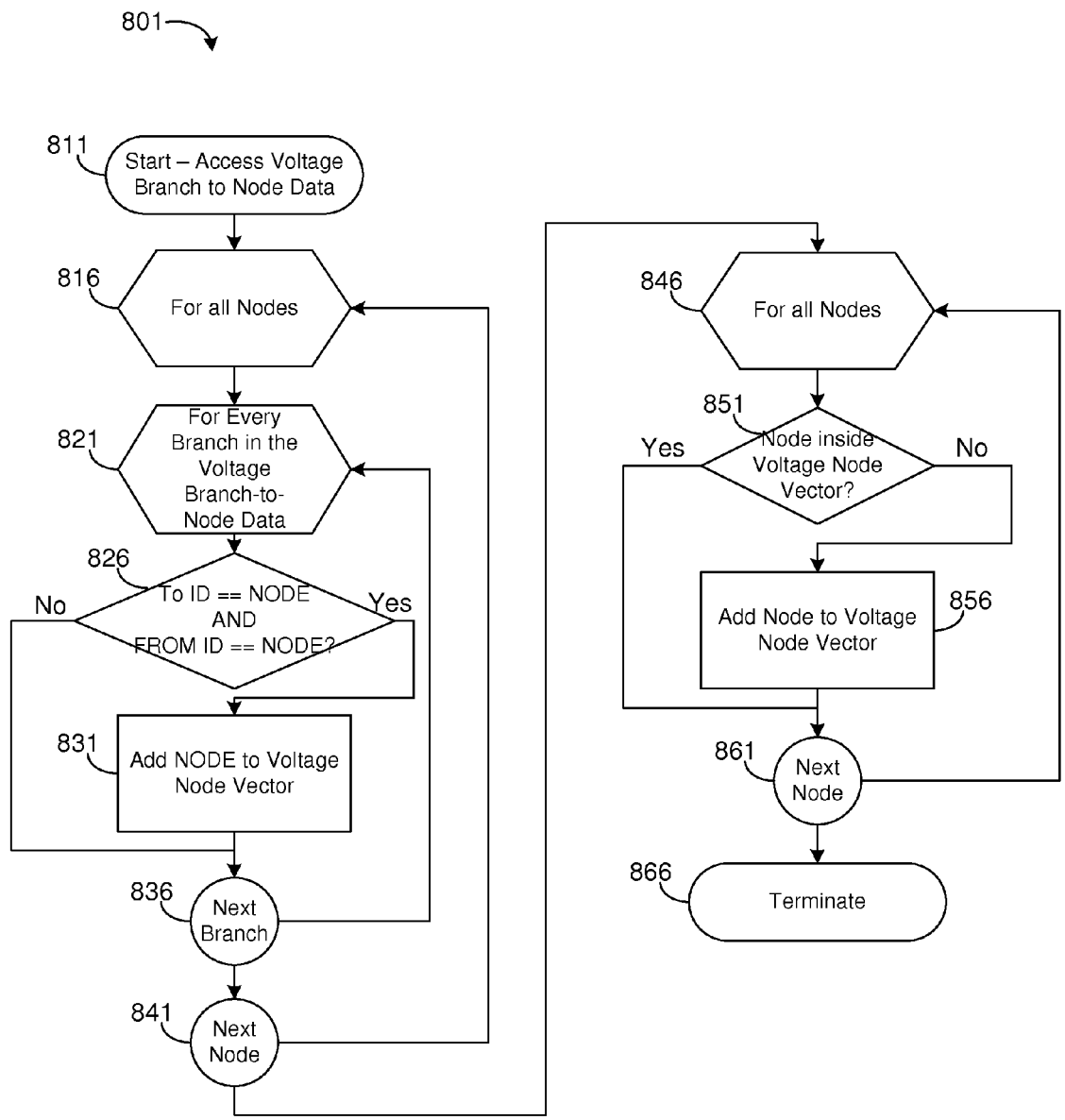
FIG. 8B is a flow diagram of one embodiment of a method for generating a voltage node vector.

FIG. 8B is a flow diagram of a method 801 for generating a voltage node vector. Method 801 may be performed substantially as described above: at step 811, a voltage node vector may be initialized; at step 816, method 801 may iterate over all of the nodes in the topology; at step 821, each branch in the voltage branch-to-node data structure may be processed; and, at step 826, each node is compared to each branch in the voltage branch-to-node data structure. At step 826, the node ID may be compared to the TO node ID and the From node ID in the voltage branch-to-node data structure. If the condition of step 826 is true (the node ID matches the TO node ID and the FROM node ID), the flow continues to step 831 where the node is added to the voltage node vector; otherwise, the flow continues to step 836.

After processing each node over steps 821-831, the flow continues to step 846 where each node in the topology is processed. At step 851, method 801 determines whether the node is in the voltage node vector. If not, the flow continues to step 856 where the node is added to the voltage node vector substantially as described above; otherwise, the flow continues to step 861 where the next node is processed.

Referring again to FIG. 5, the topology processor 570 may perform an embodiment of methods 700 and 800 on the topology data included in branch input data 572. The result may be a current branch-to-node data structure, a voltage branch-to-node data structure, a current node vector, and a voltage node vector. Applying process 800 to the SEPSN 600 depicted in FIG. 6, and current branch-to-node data structure depicted in Table 2, may result in a node vector 900 depicted in FIG. 9.

FIG. 9 depicts exemplary data structures 900 as processed by a topology processor (e.g., topology processor 570 of FIG. 5). A data structure 903 may represent a current branch-to-node data structure corresponding to the SEPSN depicted in FIG. 6. As such, data structure 903 may represent an equivalent set of data as depicted in Table 1. Data structure 903 is replicated in FIG. 9 to allow for a better depiction of the current node vector 910. The data structure 905 may represent a current branch-to-node data structure after merging branch 10 (e.g., BR6.10 of FIG. 6). Data structure 905 may represent an equivalent set of data as depicted in Table 2. Data structure 905 is replicated in FIG. 9 to allow for a better depiction of the current node vector 910.

As discussed above, the current topology branch-to-node data 903 may represent the current-branch topology of the SEPSN 600 of FIG. 6 before closing branch BR6.10. After merging branch BR6.10, references to the merged node 2 (N6.2) may be replaced with node 1 (N6.1). The current branch-to-node data 905 depicts an update to the branch-to-node data reflecting this change. In the updated current branch-to-node data 905, references to node 2 (N6.2) in branch 3-5 (BR6.3-BR6.5) have been replaced with references to node 1 (N6.1). In addition, the TO node ID in branch 10 (BR6.10) has been changed to node 1 (N6.1).

The current node vector 910 depicts one embodiment of a current node vector structure 910 corresponding to branch-to-node data structures 903 and 905. The current node vector 910 may be formed by applying an embodiment of method 800, depicted in FIG. 8, to the topology of FIG. 6 and its corresponding current branch-to-node data 905.

The current node vector 910 comprises a group node listing 920. The group node list 920 comprises a group entry (e.g., G.1) for each node in the topology. The group node list 920 depicted in FIG. 9 corresponds to a SEPSN having eleven (11) nodes, as such, the group node list 920 comprises eleven (11) group entries 920. Each entry G.1 through G.11 in the group list 920 comprises: a group identifier; the number of nodes in the group; and a pointer or other reference into a node vector 940. For example, group G.1 may comprise a group identifier "1" G.1A, the number of nodes in the group G.1B (two (2)), and a reference G.1C to the node vector 940.

After merging branch 10 (B6.10) in the SEPSN 600 of FIG. 6, a group comprising node 1 (N6.1) and node 2 (N6.2) may be formed. This may be reflected by group 1 (G.1) of the current node vector 910. Group G.1 may be identified as group 1 at entry G.1A. Entry G.1B may indicate that there are two (2) nodes comprising group 1. Entry G.1C may comprise a pointer or other reference into node vector 940. The reference of G.1C may point to the first node in the group (i.e., node 1 (N6.1)). Using the reference of G.1C and the number of nodes indicator G.1B, the nodes comprising the group can be determined by traversing node vector G.1B two (2) times. As such, group G.1 may comprise nodes demarcated by 940.1, N6.1, and N6.2. Although 910 is depicted as using an array-based relative offset addressing and/or referencing scheme, one skilled in the art would recognize that any data reference scheme could be used under the teachings of this disclosure. As such, this disclosure should not be read as limited to any particular data structure 910 format and/or data referencing technique.

As discussed above, a group whose node has been merged into another group may comprise zero (0) nodes. Group two (2) G.2 is such a group. This is because in the FIG. 9 embodiment, node 2 (N6.2) has been merged into group 1 (G.1) with the closing of branch 10 (BR6.10). As such, the number of nodes in group G.2 is zero and the reference into the reference vector may be zero (0) and/or null.

As discussed above, a group may comprise a single node. Groups G.3 through G.11 are such groups. Accordingly, G.11 comprises one (1) node (N6.11) and points to the node vector location comprising node eleven (11) (N6.11) in node vector 940.

A voltage node vector may be generated using data structures substantially equivalent to data structures 903, 905, 910, and 940 depicted in FIG. 9.

Referring again to FIG. 5, the topology processor 570 may produce an operating topology of the SEPSN comprising a current topology 582 for the current processor 580. The current topology 582 may comprise a current branch-to-node data array, a current node vector, and associated node vector. The current processor 580 may also receive current measurements 584. As discussed above, the current measurements 584 may be obtained by one or more PMUs (not shown) and/or PMCUs or relay (not shown) disposed within a substation power system network, the current measurements 584 may be time aligned substantially as described above. Also as discussed above, the current topology data 582 and current measurements 584 may be input to the current processor 580 as a tree structure (e.g., the branch input list 220 described in conjunction with FIG. 2B).

Figure 10:
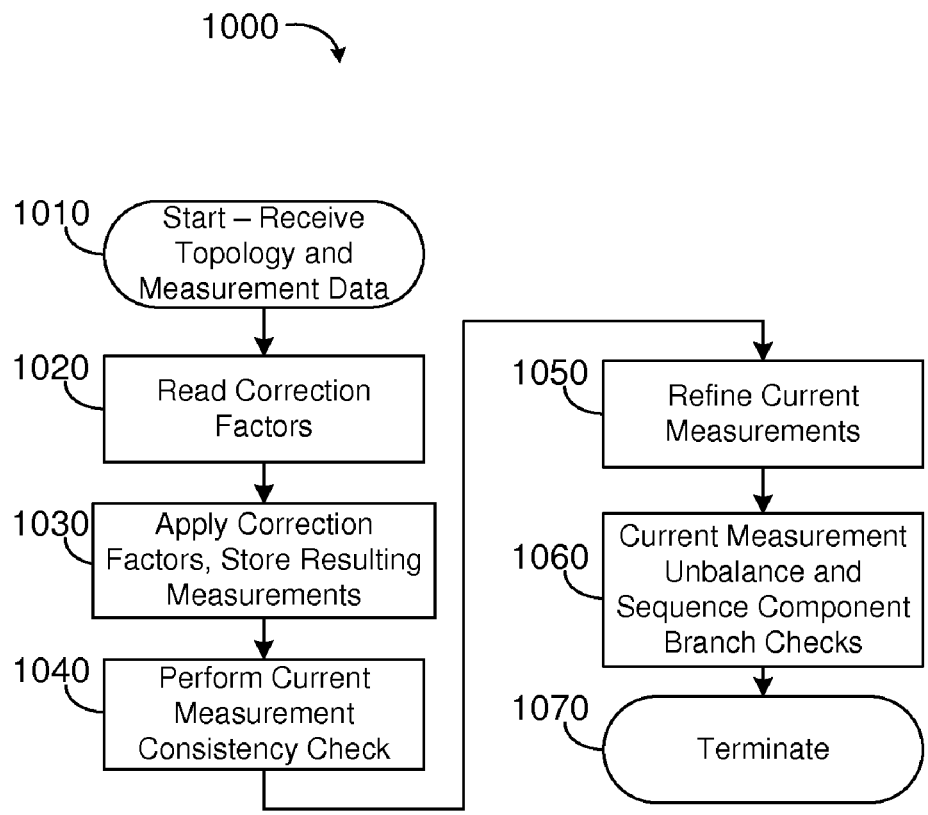
FIG. 10 is a flow diagram of a method for monitoring a substation, electrical power system network using a current topology and a plurality of current measurements.

Upon receiving current topology data 582 and current measurement data 584, the current processor 580 may be configured to inter alia, scale each current measurement by its corresponding correction factor, perform a consistency check on the current measurements, and refine the measurements. FIG. 10 depicts a flow diagram of one embodiment of a method 1000 for performing these functions.

Turning now to FIG. 10, at step 1010, method 1000 may receive a current topology, which, as discussed above, may comprise a current topology of the SEPSN (e.g., comprise a current branch-to-node data, etc.). In addition, the method 1000 may receive one or more current measurements associated with the current topology.

Figure 11:
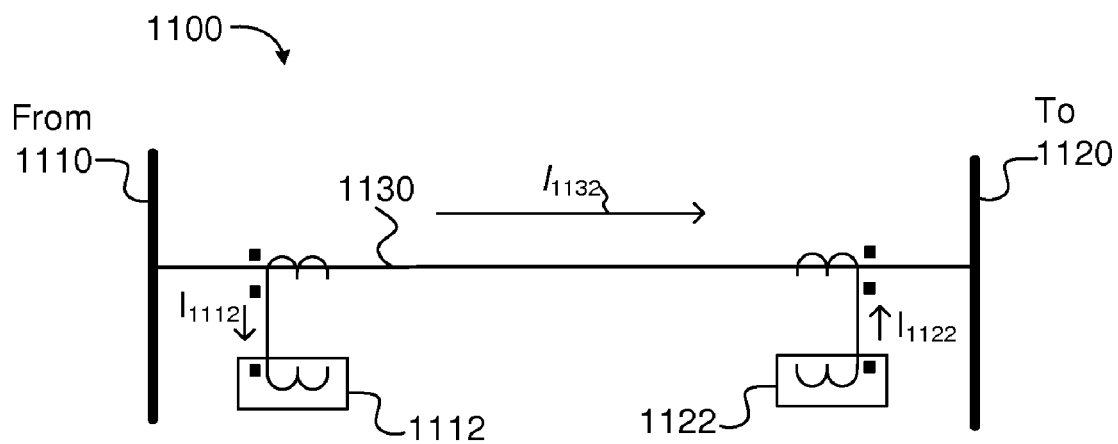
FIG. 11 is a block diagram of a polarity convention.

At step 1020, one or more correction factors may be read. The correction factors read at step 1020 may be read from the topology data discussed above. The correction factors may be used to normalize the current measurements with respect to the topology data received at step 1010. FIG. 11 depicts one embodiment of a SEPSN topology that may be used to illustrate the use of one or more current correction factors at step 1020.

Turning now to FIG. 11, node 1110 may be in electrical communication with node 1120 via a power transmission conductor 1130 to allow a current $I_{1132}$ to flow therebetween. An IED 1112, such as a PMU and/or PMCU or relay, may be communicatively coupled to transmission conductor 1130 at or near node 1110 to measure a current $I_{1112}$ thereon. Another IED 1122, which may be an IED, relay, a PMU and/or PMCU, may be communicatively coupled to transmission conductor 1130 at or near node 1120 to measure a current $I_{1122}$ thereon. Given the polarities of IED 1112 and 1122, and assuming nonexistent and/or negligible measurement error, the measured currents $I_{1112}$ and $I_{1122}$ be the inverse of one another as shown in Equation 1.1:

$$I_{1112} = -I_{1122} = I_{1132} \qquad \text{Eq. 1.1}$$

Given Equation 1.1, a first measurement correction factor for the measurement obtained at IED 1112, $k_1$ may be 1 at 0° since the current flowing from node 1110 to node 1120 may cause a secondary current to enter IED 1112. Similarly, a second measurement correction factor for the measurement obtained at IED 1122, $k_2$ may be 1 at 180° (i.e., −1) since the primary current 1132 flowing from node 1110 to node 1120 may cause a secondary current to leave IED 1122. Using these correction factors, Equation 1.1 may be rewritten as shown in Equation 1.2:

$$k_1 I_{1112} = k_2 I_{1122}, \{k_1 = 1, k_2 = -1\} \qquad \text{Eq. 1.2}$$

The current correction factors discussed above may also be adapted to take into account properties of the device (e.g., current transformer) used to obtain the current measurement. For example, a current correction factor may account for a turn ratio of the current transformer and/or IED used to obtain a current measurement (e.g., 1112 and/or 1122 of FIG. 11). Similarly, a current correction factor may address any phase shifting introduced by the current transformer and/or IED. This may allow the current correction factor to normalize measurements obtained by different current transformer types and/or configurations. As such, a current correction factor may comprise a magnitude correction factor and/or a phase correction factor. The magnitude and/or phase component of a particular current correction factor may be derived from any of the current measurement properties discussed above including, but not limited to: an orientation of the current measurement in a current topology; a current magnitude adjustment (e.g., due to current transformer turn ratio or the like); a current phase adjustment (e.g., due to current transformer phase shift); combinations thereof; and the like.

Voltage correction factors may be used to normalize voltage measurements obtained by the IEDs (e.g., IED 1112 and/or 1122 of FIG. 11). Like the current correction factors discussed above, the voltage correction factors may be used to address voltage measurement differences introduced by the transformer and/or IED used to obtain the measurements (e.g., magnitude, phase shift, and the like). Voltage correction factors may also be used to address the orientation of voltage measurements in a voltage topology (e.g., account for the polarity of a voltage measurement and the like). In addition, a voltage correction factor may address a voltage base value of a measurement (e.g., the measurement may be taken relative to a voltage base).

Referring again to FIG. 10, at step 1020, method 1000 may read and/or otherwise determine correction factors for every current measurement received at step 1010. In one embodiment, the correction factors may be static, such that they only need to be read or determined once. In other embodiments, one or more factors may be recalculated as the topology of the SEPSN changes (e.g., in response to dynamic topology data). Alternatively, correction factors associated with one or more measurements may be user supplied and stored in data structure, such as data structure 210 of FIG. 2B (e.g., element 263 of FIG. 2B). After determining the relevant current correction factors, the flow may continue to step 1030.

At step 1030, the current measurements received at step 1010 may be scaled (e.g., normalized) using the correction factors of step 1020. The scaled current measurements may be stored in a data structure for use in subsequent steps (e.g., steps 1040-1060) of method 1000. The flow may then continue to step 1040.

At step 1040, method 1000 may perform a current measurement consistency check on the scaled current measurements. One embodiment of a method to perform such a check is described below in conjunction with FIGS. 12A and B. The flow may then continue to step 1050.

Figure 13A:
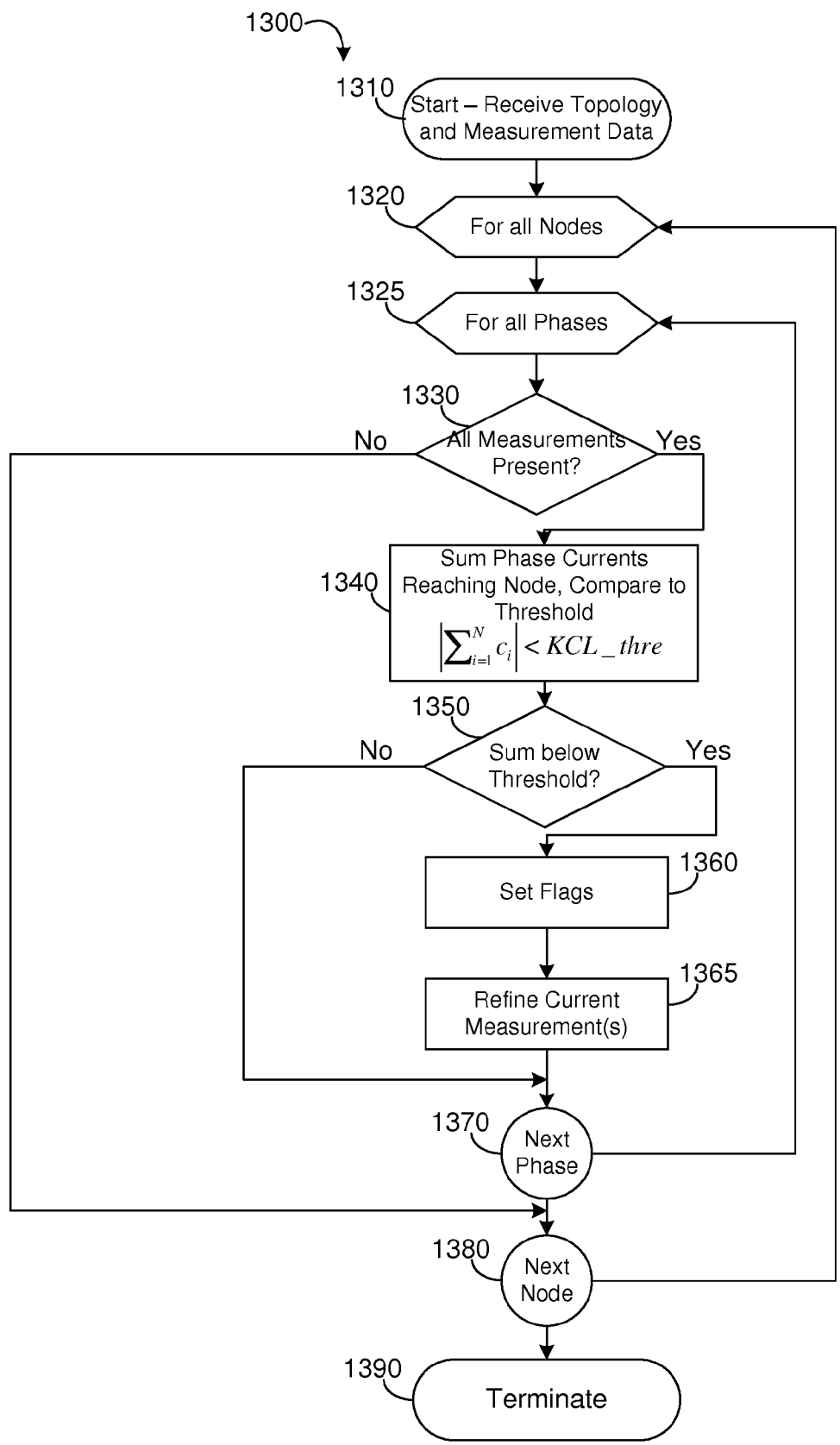
FIG. 13A is a flow diagram of a method for performing a Kirchhoff's Current Law and current measurement refinement.

At step 1050, method 1000 may refine one or more of the current measurements. One embodiment of a method for refining current measurements is described below in conjunction with FIGS. 13A and 13B. The flow may then continue to step 1060.

At step 1060, method 1000 may perform current unbalance and symmetrical component checks. One embodiment of a method for performing these checks is described below in conjunction with FIG. 14. The flow may then terminate at step 1070.

Figure 12A:
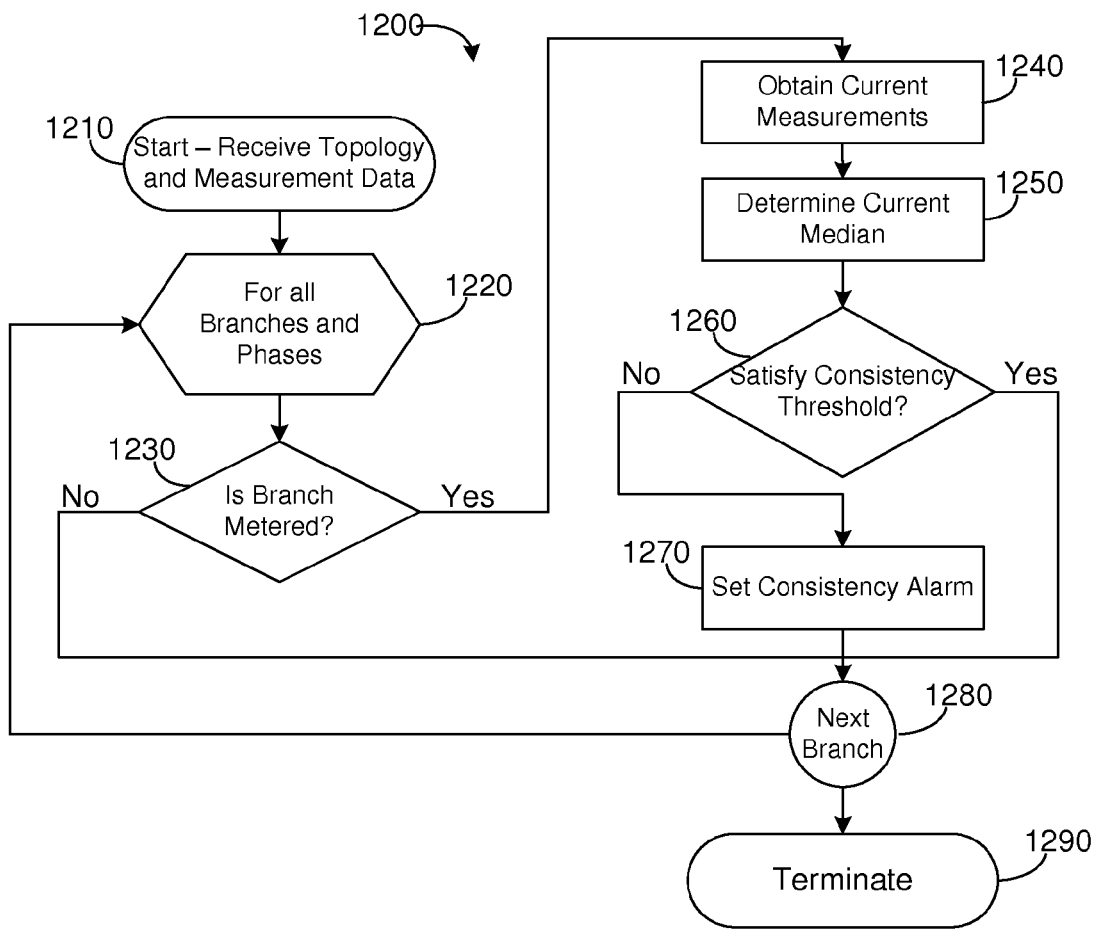
FIG. 12A is a flow diagram of a method for performing a current consistency check.

FIG. 12A is a flow diagram of one embodiment of a method 1200 for performing a current consistency check. At step 1210, topology data and one or more scaled current measurements may be received. This data may be provided by an output of method 1100 described above in conjunction with FIG. 11.

At step 1220, method 1200 may iterate each branch and phase within the topology data received at step 1210. As such, method 1200 may perform steps 1230 through 1260 for each branch and phase within the topology data of step 1210.

At step 1230, method 1200 may determine whether current measurements are available for the branch. This information may be provided in the topology data of step 1210 (e.g., number_of_current_measurements entry 256 of FIG. 2B). If there are measurements available in the branch, the flow may continue to step 1240; otherwise, the flow may continue to step 1270.

At step 1240, one or more scaled current measurements associated with the branch may be obtained. The scaled current measurements of step 1240 may be made available by another process (e.g., process 1100 described above in conjunction with FIG. 11) or may be computed at step 1240 given one or more correction factors provided in the topology data of step 1210.

At step 1250, a current measurement median may be determined. This may comprise computing the median from the available current measurements. In an alternative embodiment, step 1250 may use the average At step 1260, a consistency check may be performed on each of the current measurements for the current branch. This consistency check may comprise calculating a difference between each current measurement for the branch to the median measurement value of the branch (calculated at step 1250) against a consistency threshold value per Equation 1.4:

$$|c_i - \gamma_B| < \epsilon_B \qquad \text{Eq. 1.4}$$

In Equation 1.4, $c_i$ may be a branch current measurement corresponding to one or more current phases, $\gamma_B$ may be the median or mean current measurement for the branch and $\epsilon_B$ may be the consistency threshold for the phase and branch. If the inequality of Equation 1.4 is satisfied, the flow may continue to step 1280; otherwise, the flow may continue at step 1270.

At step 1270, a consistency alarm may be set indicating that one or more current measurements and/or phases of a current measurement fail to satisfy the consistency check of step 1260. The alarm may identify the branch, phase, and/or the one or more measurements that produced the inconsistency. The flow may continue to step 1280.

At step 1280, method 1200 may determine whether there are additional branches to process. If so, the flow may continue to step 1220; otherwise, the flow may terminate at step 1290.

Figure 12B:
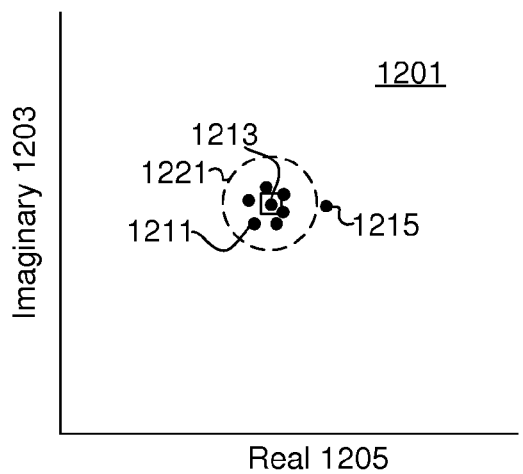
FIG. 12B is a graphical depiction of a current and/or voltage consistency check.

Turning now to FIG. 12B, a visual depiction of process 1200 is provided. In FIG. 12B, measurements 1211 corresponding to a particular branch may be plotted on plot 1201, comprising an imaginary axis 1203 and a real axis 1205. A median value 1213 of the measurements 1211 may be determined. A consistency threshold associated with the phase and branch may be depicted as 1221. The radius of 1221 may correspond to the consistency threshold value. A measurement 1215 that differs from the mean and/or media value 1213 by more than a threshold 1221 may cause a consistency alarm to be asserted.

Turning now to FIG. 13, one embodiment of a process 1300 for performing a KCL check and measurement refinement is depicted.

At step 1310, topology data and two (2) or more scaled current measurements may be received. The data received at step 1310 may be provided by an output of a method, such as 1100 described above in conjunction with FIG. 11.

At step 1320, method 1300 may iterate over each node (e.g., each entry in a current merged node array) in the topology data received at step 1310. At step 1325, method 1300 may iterate over each phase measurement available for the node and/or group of step 1320 (e.g., each phase of a three-phase, phase current, or other signal measurement).

At step 1330, method 1300 may determine whether a KCL check may be performed on the node. In some embodiments, a KCL check may require that all currents reaching a node be available. This requirement may be imposed since method 1300 may operate under the axiom that the sum of currents reaching a node should be substantially zero (0) per Kirchhoff's Current Law (KCL). If one of the current measurements is unavailable, however, the KCL axiom may not hold, and as such, process 1300 may not yield meaningful results. Similarly, where the node is part of a node group (e.g., as defined by the current node vector) a KCL check may be possible if all nodes in the group are KCL nodes (e.g., have current measurements on their associated branches). If a KCL check can be performed on the node and/or node group, the flow may continue to step 1340; otherwise, the flow may continue to step 1380 where the next node and/or phase may be processed.

At step 1340, the scaled current measurements reaching the node may be summed and compared to a KCL threshold value per Equation 1.5:

$$\left|\sum_{i=1}^{N} c_i\right| < \text{KCL\_thre} \qquad \text{Eq. 1.5}$$

In Equation 1.5, N may be the number of branches reaching a particular node group, $c_i$ may be a particular phase-current measurement, and KCL_thre may be the KCL threshold (e.g., instance 231 of FIG. 2B).

At step 1350, method 1300 may determine whether the inequality of Equation 1.5 is satisfied. If the inequality is satisfied (i.e., the absolute value of the sum is less that the KCL threshold), the flow may continue to step 1360; otherwise, the flow may continue to step 1370 where the next node and/or phase may be processed.

At step 1360, the current measurements associated with the node may be flagged appropriately (e.g., marked as satisfying the threshold of step 1340), and the flow may continue to step 1365 where the phase-current measurements may be refined.

At step 1365, the phase-current measurements may be refined. In one embodiment, refinement may comprise refining the measurements relative to an overall error metric e. In particular, the phase-current measurements: may be refined such that the overall error e is minimized. One embodiment of an approach to minimizing error is described below in conjunction with FIG. 13B.

Figure 13B:
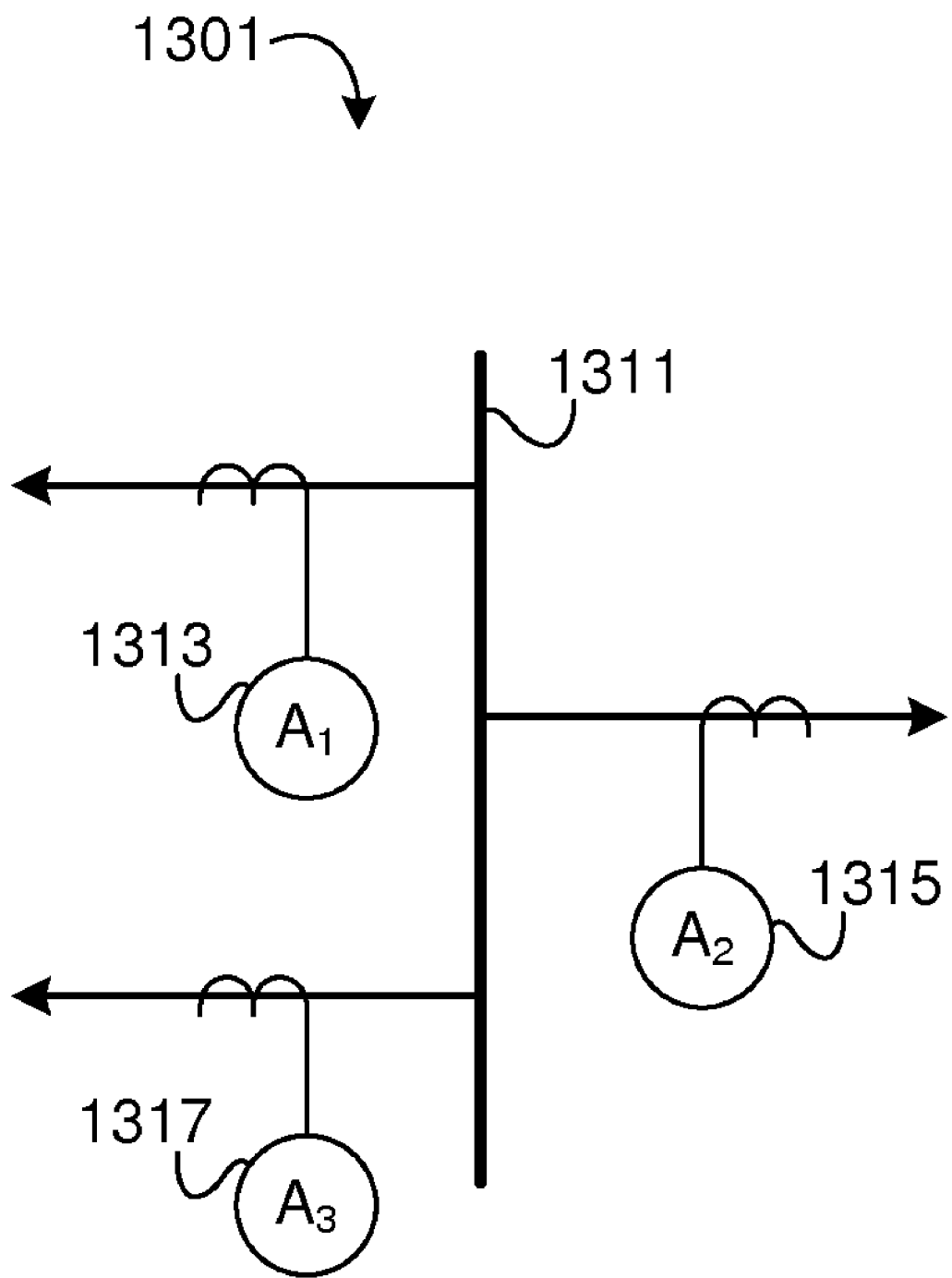
FIG. 13B is a block diagram of a portion of a substation, electrical power system network.

FIG. 13B depicts a segment 1301 of a SEPSN. The segment 1301 may comprise a node 1311 having three branches connected thereto, each comprising a scaled current measurement: 1313 ($A_1$), 1315 ($A_2$), and 1317 ($A_3$). The current measurements 1313, 1315, and 1317 may correspond to a single phase of a three-phase, current signal reaching the node 1311.

As discussed above, the threshold condition of node 1311 may be given as Equation 1.6:

$$\left| \sum_{i=1}^{3} A_i \right| < \text{KCL\_thre} \qquad \text{Eq. 1.6}$$

To refine the measurements 1313, 1315, and 1317, the overall error e may be calculated per Equation 1.7:

$$\varepsilon = \left| \sum_{i=1}^{3} I_i \right| + |I_1 - A_1| + |I_2 - A_2| + |I_3 - A_3| \qquad \text{Eq. 1.7}$$

In Equation 1.7, I may represent the metered and/or refined phase-current measurements reaching node 1311. Accordingly, Equation 1.7 equally distributes any measurement error between the three current measurements 1313 ($A_1$), 1315 ($A_2$), and 1317 ($A_3$).

To obtain a solution to minimize e, Equation 1.7 may be rewritten in matrix form as shown in Equation 1.8:

$$\left\| \begin{bmatrix} 1 & 1 & 1 \\ 1 & 0 & 0 \\ 0 & 1 & 0 \\ 0 & 0 & 1 \end{bmatrix} \begin{bmatrix} I_1 \\ I_2 \\ I_3 \end{bmatrix} - \begin{bmatrix} 0 \\ A_1 \\ A_2 \\ A_3 \end{bmatrix} \right\| = \varepsilon \qquad \text{Eq. 1.8}$$

In Equation 1.8, the problem becomes one of minimizing error e. To do so, the pseudo inverse of the matrix of Equation 1.8 may be obtained, and Equation 1.8 may be rewritten as Equation 1.9:

$$\begin{bmatrix} I_1 \\ I_2 \\ I_3 \end{bmatrix} = \begin{bmatrix} \frac{3}{4} & -\frac{1}{4} & -\frac{1}{4} \\ -\frac{1}{4} & \frac{3}{4} & -\frac{1}{4} \\ -\frac{1}{4} & -\frac{1}{4} & \frac{3}{4} \end{bmatrix} \begin{bmatrix} A_1 \\ A_2 \\ A_3 \end{bmatrix} \qquad \text{Eq. 1.9}$$

The structure of Equation 1.9 may remain constant as the number of currents reaching the node (e.g., node 1311) changes. As such, an equation for each entry in the matrix of equation 1.9 may be determined per Equation 1.10:

$$a_{i,j} = \begin{cases} n/(n+1), & \text{if } i = j \\ -1/(n+1), & \text{if } i \neq j \end{cases} \qquad \text{Eq. 1.10}$$

In Equation 1.10, n may represent the number of currents reaching a particular node and i and j may be the indices of the matrix in Equation 1.9. As such, for node 1311 of FIG. 13B, n may be three (3).

To refine the phase-current estimates, equation 1.10 may be applied to obtain entries in the matrix of Equation 1.9, and then multiply the matrix by the measurement vector (i.e., the $A_{1-n}$ vector). A closed form may be written as Equation 1.11:

$$I_i = A_i - \sum_{j=1}^{n} \frac{A_j}{n+1}, \, i = 1, 2, \ldots, n \qquad \text{Eq. 1.11}$$

As such, at step 1365, equation 1.11 may be applied to the phase-current measurements $A_i$ to thereby obtain refined measurements $I_i$. The refined measurements may be output to a HMI interface (e.g., output 585.1 in FIG. 5 to an HMI 470 of FIG. 4).

At step 1370, method 1300 may determine whether there are remaining current phases to processes. If so, the flow may continue to step 1325 where a next set of phase-current measurements of a multi-phase current (e.g., three (3)-phase current) may be processed; otherwise, the flow may continue to step 1380.

At step 1380, method 1300 may determine whether there are remaining nodes to process. If so, the flow may continue to step 1320 where the next node and/or node group may be processed; otherwise, the flow may terminate at step 1390.

Figure 14:
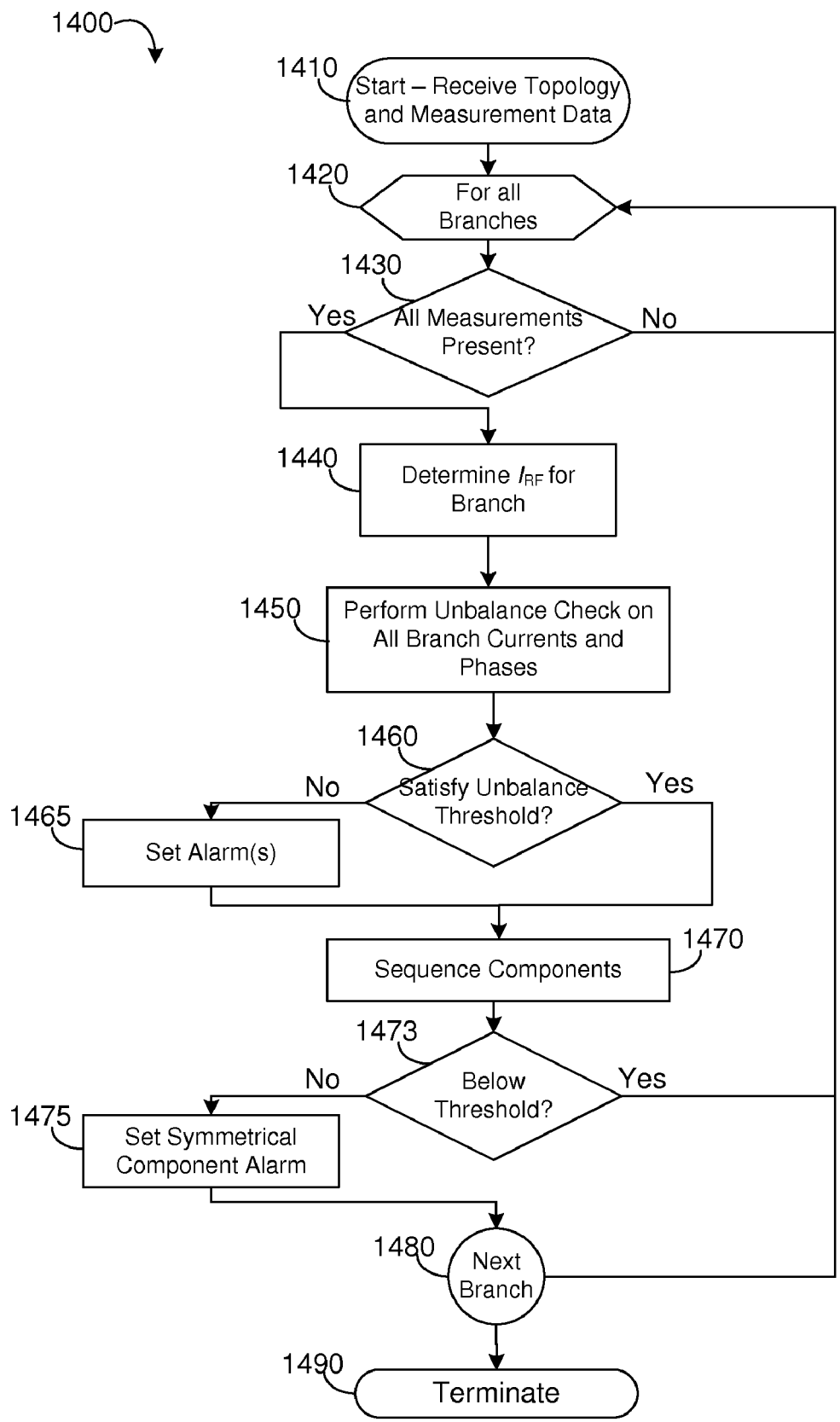
FIG. 14 is a flow diagram of a method for performing a phase current unbalance check and symmetrical components check.

Turning now to FIG. 14, a flow diagram of one embodiment of method for performing a current unbalance, symmetrical component check is depicted.

At step 1410, topology data and one (1) or more scaled current measurements may be received. The data received at step 1410 may be provided by an output of a method, such as 1100 described above in conjunction with FIG. 11.

At step 1420, method 1400 may iterate over all of the branches in the topology data received at step 1410. At step 1430, method 1400 may determine whether all phase current measurements of the particular branch are available. If so, the flow may continue at step 1440; otherwise, the flow may continue at step 1480 where the next branch may be processed.

At step 1440, an unbalanced branch check may be performed. The check of step 1440 may comprise determining a reference current ($I_{REF}$) value, which, in some embodiments, may be the median value of the phase current magnitudes at the branch. Alternatively, the $I_{REF}$ may be an average value At step 1450, a ratio of the magnitude of each phase (e.g., each phase of a three (3)-phase current) to the reference current $I_{REF}$ may be calculated per equation 1.13:

$$\text{unb}_A = \left| \frac{|I_A|}{I_{REF}} - 1 \right| \qquad \text{Eq. 1.13}$$

In Equation 1.13, $\text{unb}_A$ may be the magnitude of the ratio of a magnitude of the A phase current measurement ($I_A$) to the reference current, $I_{REF}$ minus 1. Equation 1.13, may be used to calculate the unbalance for each current phase (e.g., phases A, B, and C of a three (3)-phase current). The unbalance of Equation 1.13 may be expressed in terms of a percentage as in Equation 1.14:

$$unb_A = \left| \frac{|I_A|}{I_{REF}} - 1 \right| \cdot 100 \qquad \text{Eq. 1.14}$$

At step 1460, each of the phase-current unbalances may be compared to a user-defined unbalance threshold value associated with the branch. The topology data received at step 1410 may include these threshold values (e.g., i_unb_thre element 257.2 of FIG. 2B). If any of the phases exceeds its respective unbalance threshold, the flow may continue at step 1465; otherwise, the flow may continue to step 1470.

At step 1465, a current unbalance alarm may be set on the current measurement. The alarm of step 1465 may be set for all phases of a multi-phase current (e.g., three (3)-phase current) and/or only the phases that fail to satisfy the unbalance threshold of steps 1450. The flow may then continue to step 1470.

At step 1470, the symmetrical components (negative, positive, and zero) of the three-phase current may be calculated. At step 1473, the symmetrical components may be compared to the user-defined threshold values associated with the branch symmetrical components. The topology data received at step 1410 may include these threshold values (e.g., as one or more values in data structure 210 of FIG. 2B). If one or more symmetrical components exceeds its associated threshold, the flow may continue to step 1475; otherwise, the flow may continue to step 1480.

At step 1475, the symmetrical component alarm(s) may be set on the current and branch. After setting the alarm, the flow may continue to step 1480.

At step 1480, the next unprocessed branch (if any) may be checked, and the flow may continue to step 1420. If no branches remain to be processed, the flow may terminate at step 1490.

Referring again to FIG. 5, current processor 580 may perform method 700 (described above in conjunction with FIG. 7), which may comprise applying one or more correction factors to current measurements 584, computing a current measurement mean or median for each branch, checking branch current consistency, refining current measurements, and checking current balance and symmetrical components as described in conjunction with FIGS. 8-14.

If current refinement is possible, current processor 580 may output refined current values 585.1. In addition, the checks mentioned above (e.g., consistency, KCL, unbalance, etc.) may comprise setting an alarm relating to one or more checked current phases, currents, and/or branches. As such, after processing one or more alarms 585.2 may be output from current processor 580. As discussed above in conjunction with FIG. 4, these alarms may be routed to a HMI module (e.g., element 470 of FIG. 4) and/or a local PMCU (e.g., element 480). A HMI may display one or more alarms to an operator of the state and topology processor, and a local PMCU may use the alarm data to invoke one or more protective functions including, but not limited to: sending an alarm, tripping one or more circuit breakers, changing the configuration of one or more switches, removing and/or adding one or more loads, or the like.

Current unbalance percentage values calculated by current processor module 580 (e.g., per method 1400 described above in conjunction with FIG. 14) may be provided via output 585.3. In addition, symmetrical components associated with each branch current may be provided via output 585.4. These outputs, along with the refined measurements and alarms discussed above, may be made available to a HMI and/or local PMCU to provide monitoring and protection to a SEPSN.

The voltage processor module 590 of STP 560 may receive voltage measurement data 594 and voltage topology data 592 from the topology processor 570. As discussed above, this data may be conveyed via a data structure similar to the tree data structure described above in conjunction with FIGS. 2B and 2C. The voltage processor 590 may be configured to apply voltage correction factors to the voltage measurement data 594, calculate median phase-voltage measurement values at each node in topology data 592, perform one or more voltage consistency checks, refine the voltage measurements 594, and perform symmetrical component analysis on voltage measurements 594.

Figure 15:
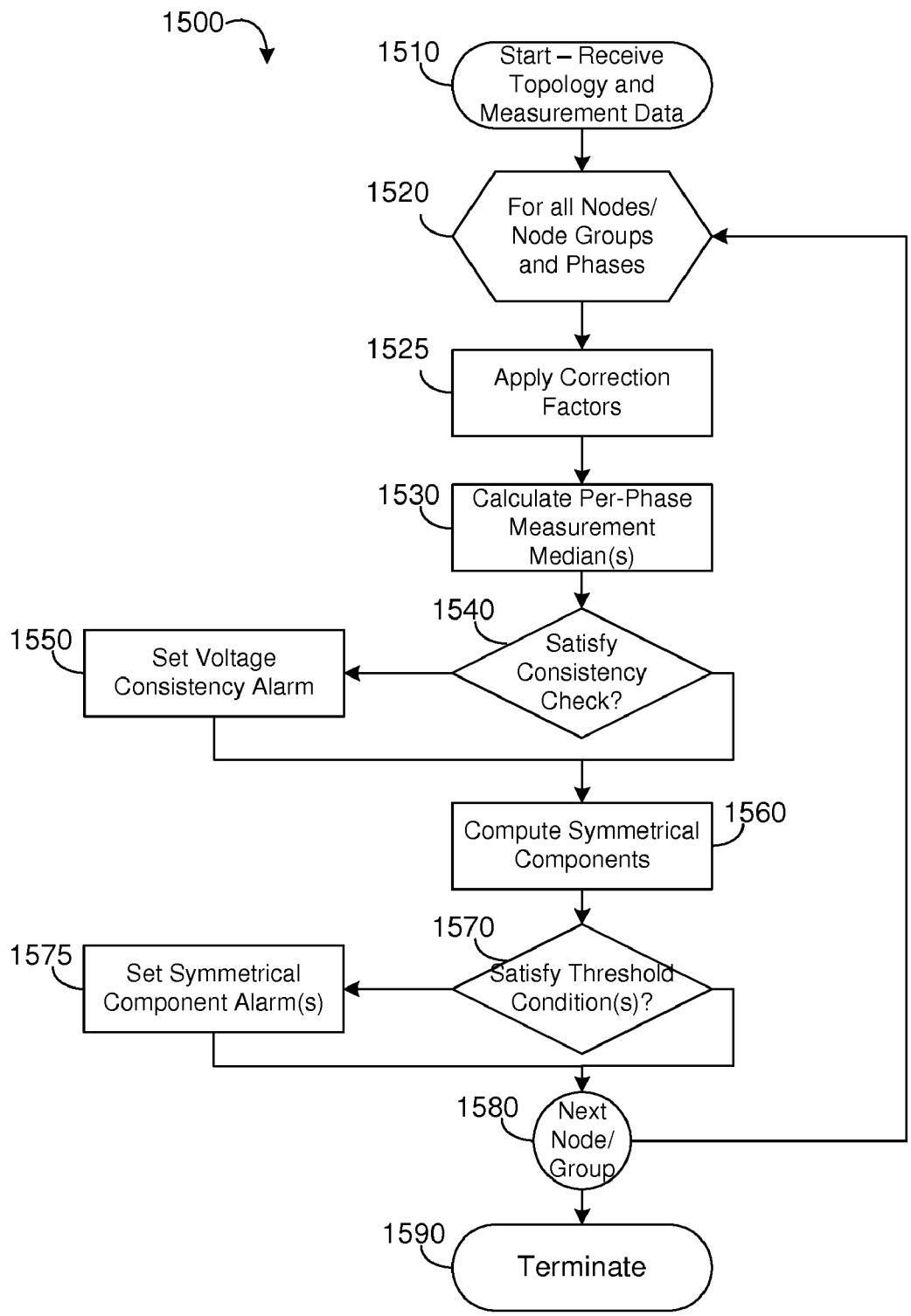
FIG. 15 is a flow diagram of a method for performing a voltage consistency check, measurement refinement, and symmetrical components check.

Turning now to FIG. 15, a flow diagram of one embodiment of a method 1500 for monitoring phrase voltages in a SEPSN is depicted. A voltage processor module, such as voltage processor module 590 of FIG. 5, may perform method 1500.

At step 1510, method 1500 may receive network topology data (e.g., a node list data structure and/or voltage merged node group), and/or one or more phase voltage measurements. The topology and phase voltage measurement data may be conveyed in a data structure similar to the "input data" data structure described above in conjunction with FIGS. 2B and 2C.

At step 1520, method 1500 may iterate over all of the node groups in the topology data received at step 1510 (e.g., all node groups in the merged group data structure).

At step 1525, one or more correction factors may be applied to the voltage measurements received at step 1510. The correction factors may be stored in the network topology data of step 1510 in, for example, voltage correction factors 277 of FIG. 2C.

At step 1530, a median value for each phase-voltage measurement may be determined. In alternative embodiments, an average phase-voltage measurement may be calculated at step 1530.

At step 1540, a voltage consistency check may be performed. The voltage consistency check of step 1540 may be similar to the current consistency check described above in conjunction with FIG. 12A. As such, the consistency check may comprise calculating a difference between each phase-voltage measurement of a particular node and/or node group to the median phase-voltage measurement calculated at step 1530. The consistency check of step 1540 may be performed for all phases of each phase voltage measurement available at a particular node group. At step 1540, if the difference between the measured voltage and the measurement median is greater than a user-defined threshold (e.g., defined in data structure 210 described above in conjunction with FIGS. 2A-C), the flow may continue to step 1550; otherwise, the flow may continue to step 1560.

At step 1550, a voltage consistency alarm may be set. The alarm may identify the voltage phase, measurement, node, and/or node group corresponding to the alarm. The flow may then continue to step 1560.

At step 1560, the symmetrical components for each group and/or node phase-voltage measurement may be calculated. At step 1570, these components may be compared to corresponding user-defined symmetrical component threshold(s). These thresholds may be stored in the data received at step 1510 (e.g., in an input data structure 210 described above in FIGS. 2B and 2C). If one or more components exceed its associated threshold, the flow may continue at step 1575; otherwise, the flow may continue to step 1580.

At step 1575, the symmetrical component alarms may be set. These alarms may identify the node and/or node group and/or the measurement producing the alarms. The flow may then continue to step 1580.

At step 1580, method 1500 may determine whether there are nodes and/or node groups remaining to process. If so, the flow may continue to step 1520 where the next node and/or node group may be processed; otherwise, the flow may terminate at step 1590.

Referring back to FIG. 5, the voltage processor 590 may perform method 1500 (described above in conjunction with FIG. 15), which may comprise applying one or more correction factors to voltage measurements 595, computing a voltage measurement median or mean for each node and/or node group, checking measurement consistency, and/or performing a symmetrical components check.

The checks discussed above (e.g., consistency, symmetrical component, etc.) may comprise setting an alarm relating to one or more phase voltages on one or more node groups, voltages, nodes, and/or node groups. As such, after processing, one or more alarms 595.2 may be output from voltage processor 590. As discussed above, alarm(s) 595.2 may be routed to HMI module (e.g., HMI 470 of FIG. 4) for display to a user. In addition, the alarms may be routed to a local PMCU (e.g., PMCU 480 of FIG. 4), which may invoke one or more protective functions responsive to the alarm(s) 595.2. These protective functions may include, but are not limited to: sending an alarm, tripping one or more circuit breakers, changing the configuration of one or more switches, removing and/or adding one or more loads, or the like. Additionally, one or more symmetrical components corresponding to voltage measurements 582 may be output at 595.3.

Referring to FIG. 4, the DP 420 may be communicatively coupled to a human machine interface (HMI) 470. As discussed above, the HMI 470 may be used to display monitoring information to a user of the DP 420. Such information may comprise refined measurements, alarms, and the like.

Figure 16:
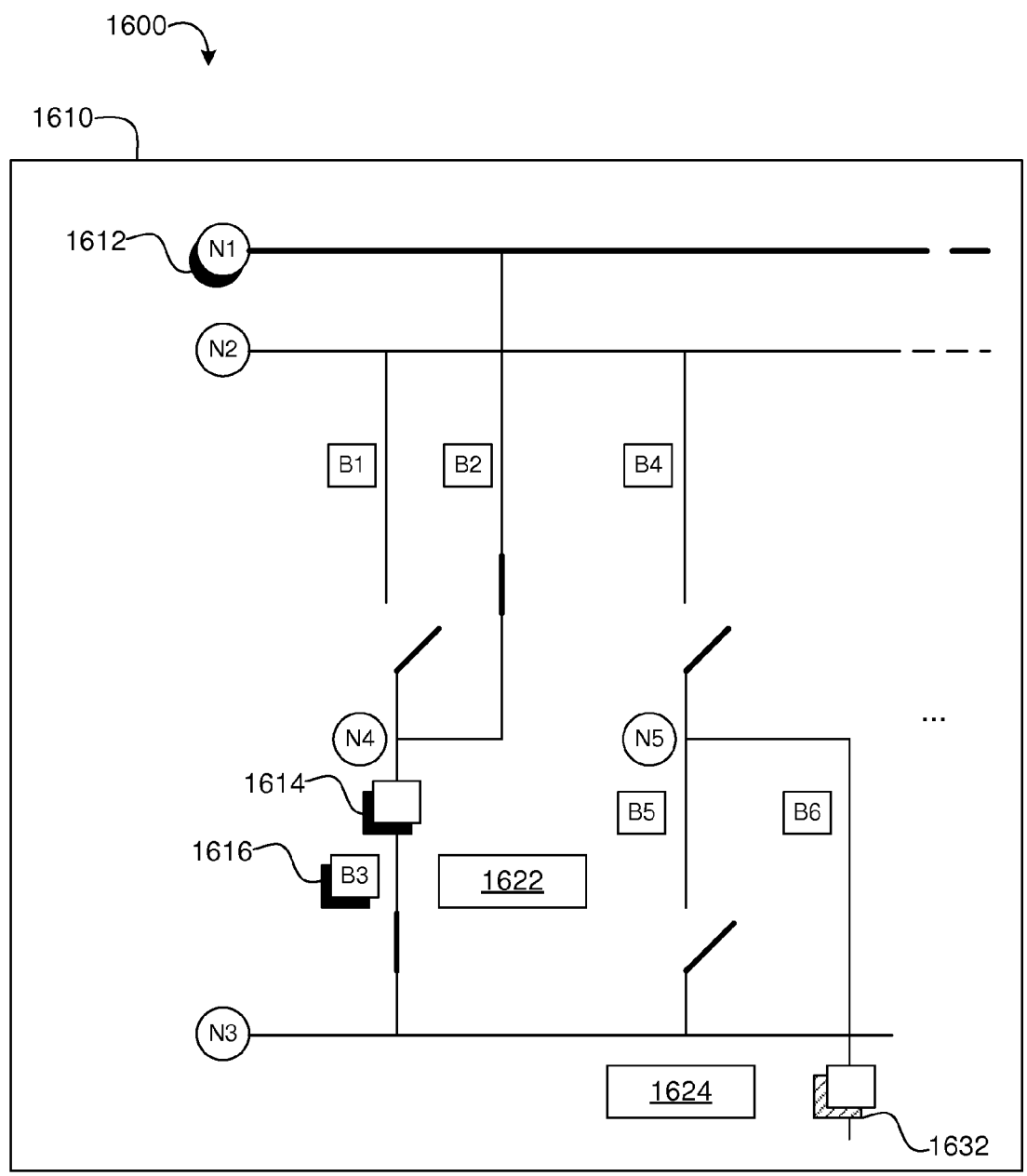
FIG. 16 depicts one embodiment of an application for visualizing a substation power system network.

FIG. 16 depicts one embodiment of an visualization interface 1600. The visualization interface 1600 may be displayed within a computer display and/or application 1610. The application 1610 may be executable on a general and/or special purpose computing device comprising a processor (not shown), input devices (not shown), such as a keyboard, mouse, or the like, data storage (not shown), such as a disc drive, memory, or the like, and one or more output devices (not shown), such as display, audio speakers, or the like. The application 1610 may be presented on the display of the computing device (not shown) and may comprise custom and/or general purpose software communicatively coupled to a state and topology processor and/or time aligned data processor (e.g., the DP 420 and/or STP 460 of FIG. 4).

The application 1610 may be configured to display a portion of the substation power system network to which the STP is connected. The display of the power system may be based upon topology data received from the DP and/or STP. In addition, the topology display may comprise the real-time operating topology as determined by the DP and/or STP. As such, the display may show the current state of one or more breakers, switches, and other connective components in the power system.

The application 1610 may display refined current and/or voltage measurements 1622 and 1624 received from the DP and/or STP. Although FIG. 16 depicts only two (2) such measurements displayed on the application 1610, one skilled in the art would recognize that any number of measurements could be displayed in the application 1610 according to the configuration of the STP and/or the power system network.

The refined measurements 1622 and 1624 may be obtained substantially as described above. For example, a refined current measurement may represent a combination of multiple current measurements as refined using an error minimization metric. Similarly, refined voltage measurements may comprise a median, average, and/or error minimized voltage measurements.

One or more alarms 1612, 1614, and/or 1616 may be displayed in the application 1610. The alarms displayed on one or more components of the electrical power system, such as electrical power system nodes (e.g., N1, N2, and so on), electrical power system branches, bus bars, or the like.

The alarms 1612, 1614, and/or 1616 may be generated responsive to any one or more of the alarm conditions described above (e.g., KCL, symmetrical components, unbalance, or the like). The alarms 1612, 1614, and/or 1616 may related to current conditions, voltage condition, branch conditions, or the like.

In addition, electrical power system components and/or measurements thereon, which have been verified as working properly may be so marked as shown 1632. Element 1632 indicates that the state of the particular branch and/or the measurements received therefrom are correct.

The application 1610 may be selectable such that selection of a particular node, branch, and/or alarm may display detailed information relating to the respective component. For example, selection of the alarm 1616 on branch B3 may cause application 1610 to display details regarding the measurements and/or alarms associated with the branch B3. One example of such a display 1700 is provided in FIG. 17.

Figure 17:
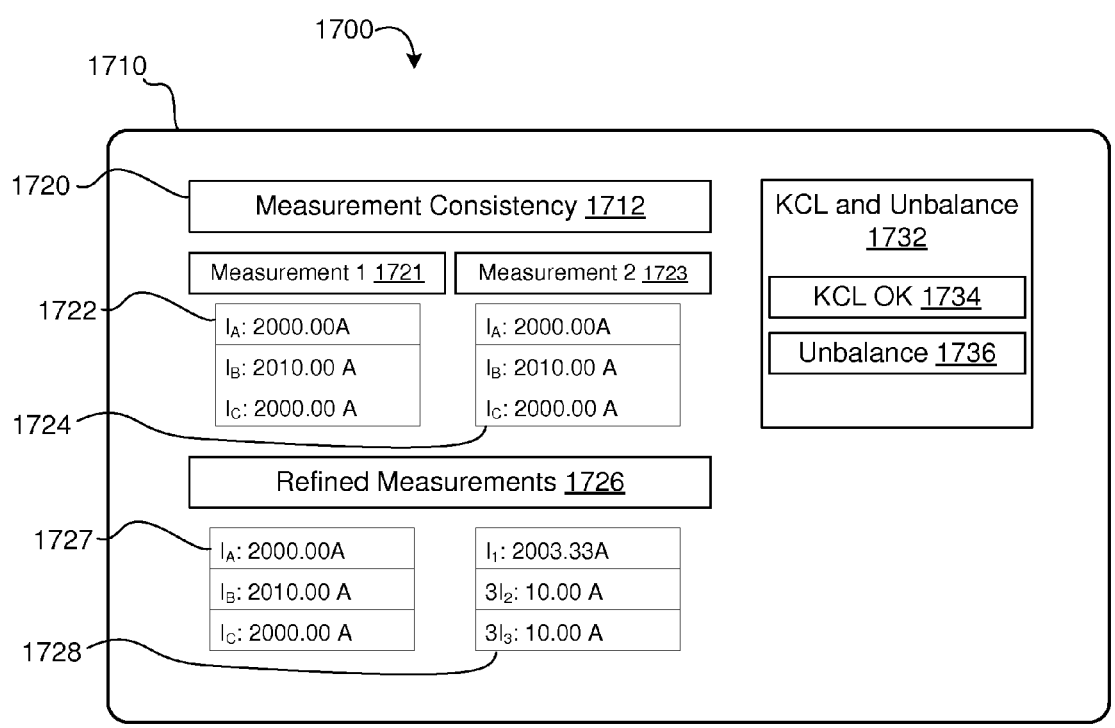
FIG. 17 depicts one embodiment of an application for visualizing measurement and/or alarm details.

As shown in FIG. 17, an application 1710 may display additional information relating to a particular component within the power system network displayed the application 1610. FIG. 17 displays details relating to a branch B3 shown in FIG. 16.

The application 1710 may comprise a measurement consistency check 1720 component, which may display each of the measurements 1721 and 1723 available at the particular component. Each measurement 1721 and 1723 may comprise a three-current measurement 1722 and 1724. A refined current measurement may be displayed at 1726, which may comprise three-phase refined measurements 1727 and/or symmetrical components 1728 of the refined measurement.

The application 1710 may further display alarms 1732 associated with the particular component. In the FIG. 17 embodiment, a KCL 1734 and unbalance alarm 1736 may be displayed. However, one skilled in the art would recognize that any number of alarms or other notices could be displayed within the application 1710. For example, if the component displayed in the application 1710 were a bus bar or node, the alarms could comprise voltage consistency alarms or the like.

As shown in FIG. 17, the KCL alarm may 1734 be shown as "OK" indicating that the measurements 1721 and 1723 satisfy KCL, and the unbalance alarm 1736 may indicate an unbalance condition at the branch.

It will be obvious to those having skill in the art that many changes may be made to the details of the above-described embodiments without departing from the underlying principles of the invention. The scope of the present invention should, therefore, be determined only by the following claims.

We claim:

1. A method for visualizing a state and topology of an electrical power system comprising a plurality of nodes interconnected by one or more branches having a plurality of intelligent electronic devices (IEDs) communicatively coupled thereto, the method comprising:

storing a static topology of the electrical power system;

receiving from the plurality of IEDs a plurality of current measurements, a plurality of voltage measurements, and dynamic topology data;

determining an operating topology of the electrical power system using the static topology and the dynamic topology data;

calculating refined current measurements and refined voltage measurements from the plurality of current measurements and the plurality of voltage measurements; and providing for displaying the operating topology, the refined current measurements, and the refined voltage measurements on a display of a human machine interface.

2. The method of claim 1, wherein the current measurements are time aligned.

3. The method of claim 1, wherein the voltage measurements are time aligned.

4. The method of claim 1, wherein the current measurements, the voltage measurements, and the dynamic topology data are time aligned.

5. The method of claim 4, wherein the current measurements and the voltage measurements comprise synchrophasors.

6. The method of claim 1, wherein calculating refined current measurements comprises normalizing one of more of the plurality of current measurements using a phase current correction factor.

7. The method of claim 1, wherein calculating refined voltage measurements comprises normalizing one or more of the plurality of voltage measurements using a phase voltage correction factor.

8. The method of claim 1, further comprising:

setting an alarm on a component of the electrical power system; and providing for displaying the alarm on the display of the human machine interface.

9. The method of claim 8, wherein setting an alarm comprises setting a current consistency alarm on a branch of the electrical power system.

10. The method of claim 8, wherein setting an alarm comprises setting a current unbalance alarm on a branch of the electrical power system.

11. The method of claim 8, wherein setting an alarm comprises setting a current symmetrical component alarm on a branch of the electrical power system.

12. The method of claim 8, wherein setting an alarm comprises setting a Kirchhoff's Current Law alarm on a branch of the electrical power system.

13. The method of claim 8, wherein setting an alarm comprises setting a voltage consistency check on a node of the electrical power system.

14. The method of claim 8, wherein setting an alarm comprises setting a voltage symmetrical component alarm on a node of the electrical power system.

15. The method of claim 8, wherein the display of the human machine interface is selectable, the method further comprising displaying data related to an alarm responsive to a selection of the alarm in the display of the human machine interface.

16. A system for visualizing a state and topology of an electrical power system comprising a plurality of nodes interconnected by one or more branches, the system comprising:

a communication module communicatively coupled to a plurality of intelligent electronic devices (IEDs), wherein each IED is communicatively coupled to a portion of the electrical power system to obtain measurement data therefrom;

a state and topology processor communicatively coupled to the communication module; and a human machine interface (HMI) comprising a display communicatively coupled to the state and topology processor, wherein the state and topology processor is configured to receive measurement data from the IEDs and to determine an operating topology of the electrical power system therefrom, and wherein HMI is configured to display the operating topology on the display to a user.

17. The system of claim 16, wherein the measurement data received from the plurality of IEDs comprises a plurality of current measurements and a plurality voltage measurements.

18. The system of claim 17, wherein the plurality of current measurements and the plurality of voltage measurements are time aligned.

19. The system of claim 18, wherein the plurality of current measurements comprise synchrophasors.

20. The system of claim 18, wherein the state and current processor is configured to normalize the plurality of time aligned current measurements and the plurality of time aligned voltage measurements using respective phase current correction factors and phase voltage correction factors.

21. The system of claim 18, wherein the HMI is configured to display one or more of the time aligned current measurements and/or one or more of the time aligned voltage measurements.

22. The system of claim 21, wherein the one or more time aligned current measurements and/or the one or more time aligned voltage measurements are displayed concurrently with the operating topology.

23. The system of claim 18, wherein the state and current processor is configured to refine one or more of the plurality of current measurements, and wherein the HMI is configured to display one or more of the refined current measurements on the display concurrently with the operating topology.

24. The system of claim 18, wherein the state and voltage processor is configured to refine one or more of the plurality of voltage measurements, and wherein the HMI is configured to display one or more of the refined voltage measurements concurrently with the operating topology.

25. The system of claim 18, wherein the state and current processor is configured to set a current alarm on one or more of the branches in the electrical power system.

26. The system of claim 25, wherein the HMI is configured to display the current alarm on the HMI display concurrently with the operating topology.

27. The system of claim 26, wherein the current alarm is one selected from the group consisting of a current consistency alarm, a current unbalance alarm, a current symmetrical component alarm, and a Kirchhoff's Current Law alarm.

28. The system of claim 18, wherein the state and current processor is configured to set a voltage alarm on one or more of the nodes in the electrical power system.

29. The system of claim 28, wherein the HMI is configured to display the current alarm on the HMI display concurrently with the operating topology.

30. The system of claim 29, wherein the voltage alarm is one selected from the group consisting of a voltage consistency alarm and a voltage symmetrical component alarm.

31. A system for visualizing a state and topology of an electrical power system comprising a plurality of nodes interconnected by one or more branches, the system comprising:

a communication module communicatively coupled to a plurality of intelligent electronic devices (IEDs), wherein each of the plurality of IEDs is communicatively coupled to a respective portion of the electrical power system to obtain measurement data therefrom;

a state and topology processor comprising a static topology of the electrical power system communicatively coupled to the communication module to receive a plurality of time aligned current measurements, a plurality of time aligned voltage measurements, and dynamic topology data therefrom, wherein the state and topology processor is configured determine an operating topology of the electrical power system, to refine one or more of the plurality of current measurements, to refine one or more of the plurality of voltage measurements, and to set one or more alarms on one or more components of the electrical power system responsive to receiving the time aligned current measurements, time aligned voltage measurements, and dynamic topology data from the plurality of IEDs; and a human machine interface (HMI) comprising a display communicatively coupled to the state and topology processor, wherein the HMI is configured to display the operating topology, the one or more refined current measurements, the one or more refined voltage measurements, and the one or more alarms on the display.

* * * * *